United States Patent
Kubota et al.

(10) Patent No.: US 9,082,976 B2
(45) Date of Patent: Jul. 14, 2015

(54) PIEZOELECTRIC CERAMICS, MANUFACTURING METHOD FOR PIEZOELECTRIC CERAMICS, PIEZOELECTRIC ELEMENT, LIQUID DISCHARGE HEAD, LIQUID DISCHARGE APPARATUS, ULTRASONIC MOTOR, OPTICAL APPARATUS, VIBRATION GENERATOR, DUST REMOVING DEVICE, IMAGING APPARATUS, AND ELECTRONIC APPARATUS

(75) Inventors: Makoto Kubota, Yokohama (JP); Takayuki Watanabe, Yokohama (JP); Hisato Yabuta, Machida (JP); Jumpei Hayashi, Chofu (JP); Nobuhiro Kumada, Kofu (JP); Satoshi Wada, Kofu (JP)

(73) Assignees: Canon Kabushiki Kaisha, Tokyo (JP); University of Yamanashi, Kofu-shi (JP)

(*) Notice: Subject to any disclaimer, the term of this patent is extended or adjusted under 35 U.S.C. 154(b) by 311 days.

(21) Appl. No.: 13/599,689

(22) Filed: Aug. 30, 2012

(65) Prior Publication Data

US 2013/0056671 A1 Mar. 7, 2013

(30) Foreign Application Priority Data

Sep. 6, 2011 (JP) .................................. 2011-194101
Aug. 29, 2012 (JP) .................................. 2012-189004

(51) Int. Cl.
*H01L 41/18* (2006.01)
*H01L 41/187* (2006.01)
(Continued)

(52) U.S. Cl.
CPC ........... *H01L 41/187* (2013.01); *B41J 2/14233* (2013.01); *C01G 23/006* (2013.01);
(Continued)

(58) Field of Classification Search
CPC ............ H01L 41/0973; H01L 41/1878; H01L 41/187; H01L 41/1871; H01L 41/18; H01L 41/43; H01L 21/31691; C04B 35/475; C04B 35/462; C04B 35/4682; C04B 35/64; C04B 2235/3298; C04B 2235/768; C04B 2235/3206; C04B 2235/3215; C04B 2235/3234; C04B 2235/787; C04B 2235/76; C04B 2235/762; C04B 2235/3279; C04B 2235/5445; C04B 2235/5436; C04B 2235/6027; C04B 2235/605; C04B 2235/786; C01P 2002/52; C01P 2002/34; C01P 2002/05; C01P 2004/64; C01G 23/003; C01G 23/006; C01G 29/006
USPC .................. 252/62.9, 62.9 PZ; 501/134–139; 310/311, 357, 358
See application file for complete search history.

(56) References Cited

U.S. PATENT DOCUMENTS

| 2,988,422 A | 6/1961 | Walsh |
| 8,216,858 B2 | 7/2012 | Takashima et al. |

(Continued)

FOREIGN PATENT DOCUMENTS

| JP | 2008-037064 A | 2/2008 |
| JP | 2008-150247 A | 7/2008 |

(Continued)

OTHER PUBLICATIONS

Dolgos et al., "Chemical control of octahedral tilting and off-axis A cation displacement allows ferroelectric switching in a bismuth-based perovskite", published online Feb. 20, 2012, Chem. Sci, vol. 3, pp. 1426-1435.*

(Continued)

*Primary Examiner* — C Melissa Koslow
*Assistant Examiner* — Lynne Edmondson
(74) *Attorney, Agent, or Firm* — Fitzpatrick, Cella, Harper & Scinto

(57) ABSTRACT

Provided is a piezoelectric ceramics that can achieve both high piezoelectric performance and a high Curie temperature. Also provided are a piezoelectric element, a liquid discharge head, an ultrasonic motor, and a dust removing device, which use the piezoelectric ceramics. The piezoelectric ceramics include a perovskite-type metal oxide expressed by a general formula (1): $xBaTiO_3$-$yBiFeO_3$-$zBi(M_{0.5}Ti_{0.5})O_3$, where M represents at least one type of element selected from the group consisting of Mg and Ni, x satisfies $0.40 \le x \le 0.80$, y satisfies $0 \le y \le 0.30$, z satisfies $0.05 \le z \le 0.60$, and $x+y+z=1$ is satisfied, and are oriented in a (111) plane in a pseudocubic expression.

16 Claims, 13 Drawing Sheets

(51) Int. Cl.
*H01L 41/00* (2013.01)
*C04B 35/00* (2006.01)
*H02N 2/00* (2006.01)
*C04B 35/468* (2006.01)
*H01L 41/43* (2013.01)
*H01L 41/09* (2006.01)
*H02N 2/10* (2006.01)
*H02N 2/16* (2006.01)
*B41J 2/14* (2006.01)
*C04B 35/475* (2006.01)
*C04B 35/626* (2006.01)
*C04B 35/64* (2006.01)
*C01G 23/00* (2006.01)
*C01G 53/00* (2006.01)

(52) U.S. Cl.
CPC .......... *C01G 53/70* (2013.01); *C04B 35/4682* (2013.01); *C04B 35/475* (2013.01); *C04B 35/6265* (2013.01); *C04B 35/64* (2013.01); *H01L 41/0973* (2013.01); *H01L 41/1871* (2013.01); *H01L 41/1878* (2013.01); *H01L 41/43* (2013.01); *H02N 2/106* (2013.01); *H02N 2/163* (2013.01); *B41J 2202/03* (2013.01); *C01P 2002/52* (2013.01); *C01P 2002/54* (2013.01); *C01P 2002/76* (2013.01); *C04B 2235/3206* (2013.01); *C04B 2235/3215* (2013.01); *C04B 2235/3234* (2013.01); *C04B 2235/3236* (2013.01); *C04B 2235/3251* (2013.01); *C04B 2235/3262* (2013.01); *C04B 2235/3274* (2013.01); *C04B 2235/3279* (2013.01); *C04B 2235/3281* (2013.01); *C04B 2235/3298* (2013.01); *C04B 2235/5436* (2013.01); *C04B 2235/605* (2013.01); *C04B 2235/6027* (2013.01); *C04B 2235/6567* (2013.01); *C04B 2235/77* (2013.01); *C04B 2235/786* (2013.01)

(56) References Cited

U.S. PATENT DOCUMENTS

| 2005/0188916 | A1* | 9/2005 | Riman et al. ............... 117/21 |
| 2011/0193451 | A1 | 8/2011 | Watanabe et al. |
| 2011/0221302 | A1 | 9/2011 | Yabuta et al. |
| 2011/0298336 | A1 | 12/2011 | Saito et al. |
| 2013/0270965 | A1 | 10/2013 | Hayashi et al. |

FOREIGN PATENT DOCUMENTS

| WO | 2012/091147 A1 | 7/2012 |
| WO | 2013/137421 A2 | 9/2013 |

OTHER PUBLICATIONS

Iwanami Physicochemical Dictionary, pp. 1268-1269, Fifth Edition (Iwanami Shoten, published on Feb. 20, 1998).

Arend et al., "Phase Composition of Reduced and Reoxided Barium Titanate", J. Am. Ceram. Soc. vol. 52, No. 2, Feb. 21, 1969, pp. 63-65.

Arend et al., "Importance of Oxidation and Reduction of Barium Titanate in Material Science", Ferroelectrics, 1997, vol. 202, pp. 1-10.

Glaister et al., "An Investigation of the Cubic-Hexagonal Transition in Barium Titanate", Proceedings of the Physical Society, 1960, pp. 763-771.

Non-final Office Action in U.S. Appl. No. 13/023,043 (dated Apr. 29, 2013).

Makiya et al., "Particle Oriented Bismuth Titanate Ceramics Made in High Magnetic Field", Journal of the Ceramic Society of Japan, 111, pp. 702-704, 2003.

Kirianov et al., "Studies on the Solid Solution of Mn in BaTiO3", Japan Journal of Applied Physics vol. 40, Part 1, No. 9B, pp. 5619-5623, 2001.

M. Kumar et al., "Structure Property Relations in BiFeO3/ BaTiO3 Solid Solutions," 87(2) J. Appl. Phys. vol. 855-862 (2000).

Satoshi Wada et al., "Enhanced Piezoelectric Property of Barium Titanate Single Crystals with Engineered Domain Configurations," 38(1) Jpn. J. Appl. Phys. 5505-5511 (1999).

\* cited by examiner

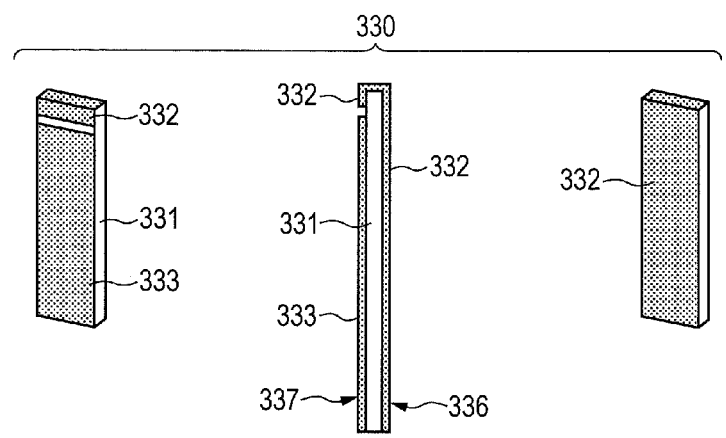
FIG. 10A    FIG. 10B    FIG. 10C
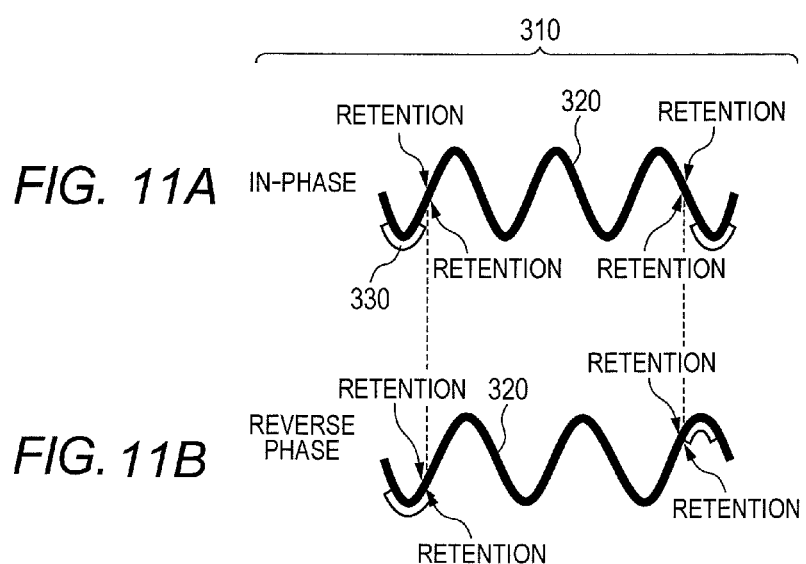
FIG. 11A
FIG. 11B

PIEZOELECTRIC CERAMICS, MANUFACTURING METHOD FOR PIEZOELECTRIC CERAMICS, PIEZOELECTRIC ELEMENT, LIQUID DISCHARGE HEAD, LIQUID DISCHARGE APPARATUS, ULTRASONIC MOTOR, OPTICAL APPARATUS, VIBRATION GENERATOR, DUST REMOVING DEVICE, IMAGING APPARATUS, AND ELECTRONIC APPARATUS

BACKGROUND OF THE INVENTION

1. Field of the Invention

The present invention relates to a piezoelectric ceramics and a manufacturing method therefore, and more particularly, to a lead-free piezoelectric ceramics. The present invention also relates to a piezoelectric element, a liquid discharge head, a liquid discharge apparatus, an ultrasonic motor, an optical apparatus, a vibration generator, a dust removing device, an imaging apparatus, and an electronic apparatus, which use the piezoelectric ceramics.

2. Description of the Related Art

A commonly used piezoelectric ceramics is an $ABO_3$-type perovskite metal oxide such as lead zirconate titanate (hereinafter, referred to as "PZT"). However, it is considered that PZT, which contains lead as an A-site element, may cause environmental problems. Therefore, a piezoelectric ceramics with a lead-free perovskite-type metal oxide has been desired.

Barium titanate is known as a piezoelectric ceramics with a lead-free perovskite-type metal oxide. Japanese Patent Application Laid-Open No. 2008-150247 discloses barium titanate prepared by a resistance heating/two-step sintering technique. Japanese Patent Application Laid-Open No. 2008-150247 describes that ceramics with excellent piezoelectric property can be obtained when nano-sized barium titanate powder is sintered by the two-step sintering technique. However, barium titanate has a problem in that depolarization is caused by continuous driving of a device at high temperature (for example, 80° C. or more) because its Curie temperature is low at 125° C. In addition, because barium titanate has a structural phase transition temperature between orthorhombic and tetragonal at a temperature close to a room temperature, barium titanate has a problem in that its performance at a practical temperature becomes unstable.

In addition, "Journal of Applied Physics" 2008, Volume 87, Issue 2, pp. 855-862 discloses a solid solution of barium titanate and bismuth ferrite as an attempt to increase the Curie temperature of barium titanate. However, as the solid solution amount of the bismuth ferrite increases, the Curie temperature increases while a piezoelectric constant is conspicuously decreased.

In other words, it is difficult to achieve both high piezoelectric performance and a high Curie temperature in a piezoelectric ceramics of the lead-free perovskite-type metal oxide.

SUMMARY OF THE INVENTION

The present invention has been made to address such a problem, and therefore provides a piezoelectric ceramics that can achieve both high piezoelectric performance and a high Curie temperature, and a manufacturing method for the piezoelectric ceramics.

In addition, the present invention provides a piezoelectric element, a liquid discharge head, a liquid discharge apparatus, an ultrasonic motor, an optical apparatus, a vibration generator, a dust removing device, an imaging apparatus, and an electronic apparatus, which use the piezoelectric ceramics.

A piezoelectric ceramics according to the present invention include a perovskite-type metal oxide expressed by the following general formula (1): $xBaTiO_3$-$yBiFeO_3$-$zBi(M_{0.5}Ti_{0.5})O_3$, where M represents at least one type of element selected from the group consisting of Mg and Ni, x satisfies $0.40 \leq x \leq 0.80$, y satisfies $0 \leq y \leq 0.30$, z satisfies $0.05 \leq z \leq 0.60$, and $x+y+z=1$ is satisfied, and are (111) oriented in a pseudocubic expression.

A manufacturing method for a piezoelectric ceramics according to the present invention includes obtaining slurry containing at least hexagonal barium titanate, placing the slurry on a substrate, applying a magnetic field to the slurry to obtain a compact, and performing oxidation treatment of the compact.

According to the present invention, there is provided a piezoelectric element, including a first electrode, a piezoelectric ceramics, and a second electrode, in which the piezoelectric ceramics include the above-mentioned piezoelectric ceramics.

A liquid discharge head according to the present invention uses the above-mentioned piezoelectric element.

A liquid discharge apparatus according to the present invention includes a transport unit configured to transport a recording medium and the liquid discharge head described above.

An ultrasonic motor according to the present invention uses the above-mentioned piezoelectric element.

An optical apparatus according to the present invention includes a driving unit including the ultrasonic motor described above.

A vibration generator according to the present invention includes a vibration body arranged the above piezoelectric element.

A dust removing device according to the present invention includes a vibration portion having the above vibration generator.

An imaging apparatus according to the present invention includes the above dust removing device and an image pickup element unit in which a vibration member of the above dust removing device is provided on a side of a light receiving surface of the image pickup element unit.

An electronic apparatus according to the present invention includes a piezoelectric acoustic component including the piezoelectric element described above.

According to the present invention, it is possible to provide a piezoelectric ceramics that achieve both high piezoelectric performance and high Curie temperature, and a manufacturing method for a piezoelectric ceramics.

Through the use of the piezoelectric ceramics of the present invention, it is possible to provide a liquid discharge head having nozzle density and discharge capacity equal to or higher than those in the case where a piezoelectric ceramics including lead is used.

A liquid discharge apparatus equipped with a liquid discharge head according to an embodiment of the present invention can exhibit discharge force and discharge accuracy comparable or superior to a liquid discharge apparatus that uses a liquid discharge head including a lead-containing piezoelectric element.

Through the use of the piezoelectric ceramics of the present invention, it is possible to provide an ultrasonic motor having driving power and durability equal to or higher than those in the case where a piezoelectric ceramics including lead is used.

An optical apparatus that uses the ultrasonic motor can exhibit durability and operation accuracy comparable or superior to an optical apparatus that uses an ultrasonic motor that includes a lead-containing piezoelectric element.

Through the use of the piezoelectric ceramics according to the present invention, it is possible to provide a vibration generator having vibration efficiency equal to or higher than a vibration generator that includes lead-containing piezoelectric ceramics.

Through the use of the vibration generator of the present invention, it is possible to provide a dust removing device having dust removing efficiency equal to or higher than a dust removing device that includes lead-containing piezoelectric ceramics.

Through the use of the dust removing device of the present invention, it is possible to provide an imaging apparatus having a dust removing function equal to or higher than an imaging apparatus that includes lead-containing piezoelectric ceramics.

An electronic apparatus that uses a piezoelectric acoustic component equipped with a piezoelectric element or multi-layered piezoelectric element according to an embodiment of the present invention exhibits a sound-generating property comparable or superior to an electronic apparatus that includes a lead-containing piezoelectric element.

Further features of the present invention will become apparent from the following description of exemplary embodiments with reference to the attached drawings.

BRIEF DESCRIPTION OF THE DRAWINGS

FIGS. 10A to 10C are schematic diagrams illustrating a structure of a piezoelectric element in a dust removing device according to the present invention.

FIGS. 11A and 11B are schematic diagrams illustrating a vibration principle of the dust removing device according to the present invention.

DESCRIPTION OF THE EMBODIMENTS

Figure 1:
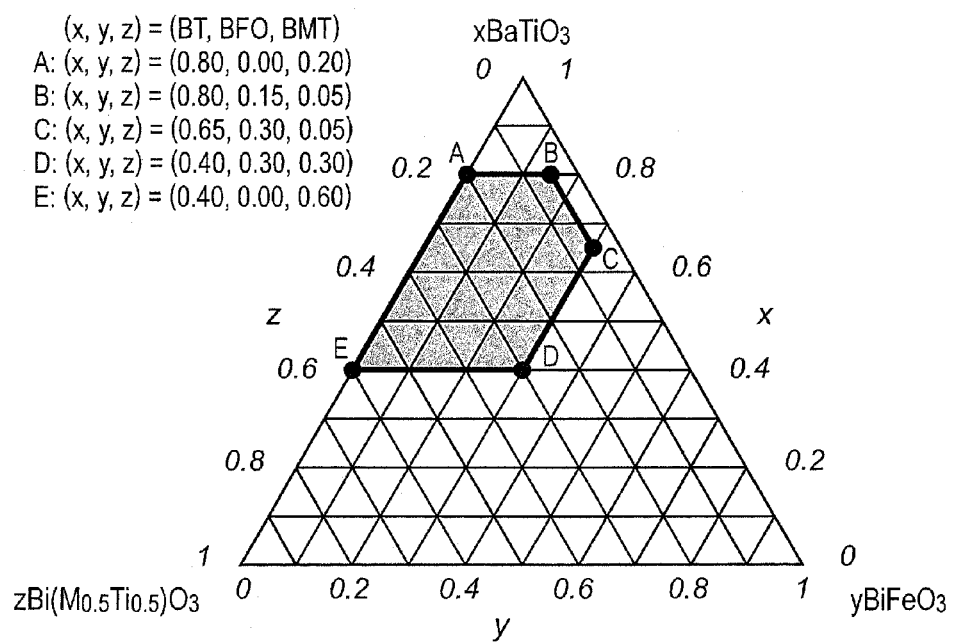
FIG. 1 is a triangle phase diagram illustrating a composition range of a piezoelectric ceramics according to the present invention.

Preferred embodiments of the present invention will now be described in detail in accordance with the accompanying drawings.

Piezoelectric ceramics according to the present invention include a perovskite-type metal oxide expressed by the following general formula (1): $xBaTiO_3$-$yBiFeO_3$-$zBi(M_{0.5}Ti_{0.5})O_3$ ... (1), where M represents at least one type of element selected from the group consisting of Mg and Ni, x satisfies $0.40 \leq x \leq 0.80$, y satisfies $0 \leq y \leq 0.30$, z satisfies $0.05 \leq z \leq 0.60$, and $x+y+z=1$ is satisfied, and is (111) oriented in a pseudocubic expression.

The term "ceramics" used herein refers to an aggregate (also referred to as bulk) of crystal particles sintered by thermal treatment, or the so-called polycrystal state, in which the main component thereof is a metal oxide. The term also includes one processed after sintering. However, the term does not include any powder or powder-dispersed slurry.

The "perovskite-type metal oxide" of the present invention refers to a metal oxide having a perovskite-type structure that is ideally a cubic structure as described in Iwanami Physicochemical Dictionary, Fifth Edition (Iwanami Shoten, published on Feb. 20, 1998). The metal oxide having a perovskite-type structure is generally expressed by chemical formula of $ABO_3$. In the perovskite-type metal oxide, the elements A and B occupy specific positions in a form of ions in a unit cell, which are called A site and B site. For instance, in a cubic unit cell, the element A is positioned at a vertex of the cube while the element B is positioned at the body center. The element O occupies a face center position as an anion of oxygen.

The metal oxide expressed by the general formula (1) refers to a solid solution of three perovskite-type metal oxides that are expressed by $BaTiO_3$, $BiFeO_3$, and $Bi(M_{0.5}Ti_{0.5})O_3$. In the general formula (1), a metal element positioned at the A site is mainly Ba and Bi, and a metal element positioned at the B site is at least one type of element selected from the group consisting of Ti, Fe, Mg, and Ni.

In the general formula (1), an element content ratio between the A site and the B site is expressed as 1:1. However, even if the element content ratio is shifted slightly, as long as the metal oxide expressed by the general formula (1) is in a single phase state constituted of only the perovskite-type structure, an advantageous effect of the present invention can be obtained. In a piezoelectric ceramics including a general perovskite-type metal oxide, it is well known to set an A-site element to be excessive by approximately 50% at most, and it is well known that a measured B-site element ratio is shifted from a stoichiometric ratio in a composite perovskite-type structure.

It is determined that the piezoelectric ceramics are the perovskite-type structure from structure analysis using X-ray diffraction or electron diffraction, for example.

The piezoelectric ceramics of the present invention are (111) oriented in the pseudocubic expression. The perovskite-type metal oxide constituting the piezoelectric ceramics of the present invention has any one of a tetragonal, orthorhombic, monoclinic, rhombohedral, and cubic, or multiple crystal systems among these simultaneously. However, for simplicity of expression, it is assumed that the perovskite-type metal oxide has a pseudocubic structure in this specification unless otherwise noted. In other words, the phrase "(111) orientation", "(111) plane", or "(111) axis" is based on an expression which assumes that a unit cell of a crystal cubic.

The term "orientation" used herein refers to a state in which that a whole or a part of a target crystal plane is aligned in a specific direction. In addition, the phrase "degree of orientation" used herein refers to a degree of the above-mentioned orientation. As the part in which the target crystal plane is aligned in a specific direction is larger, the degree of orientation is higher. In other words, the phrase "state of being (111) oriented" refers to a state in which the crystal plane represented by (111) is aligned in a specific direction. The phrase "state of being oriented in a (111) plane" has the same meaning. In order to obtain the advantageous effect of the present invention, it is preferred to set a vertical axis direction of the oriented (111) plane to be identical to a thickness direction of the piezoelectric ceramics.

As described also in "Japanese Journal of Applied Physics" 1999, Volume 38, pp. 5505-5511, the piezoelectric ceramics including the perovskite-type metal oxide can provide a good piezoelectric property when a voltage is applied to a <111> direction so that an engineered domain structure is formed. In other words, it is known that the (111) oriented piezoelectric ceramics have a piezoelectric constant larger than that of a piezoelectric ceramics having no orientation or a piezoelectric ceramics oriented in another plane. Further, in case of the composition containing tetragonal barium titanate as in the present invention, because of contribution of a large piezoelectric constant $d_{15}$ unique to barium titanate, piezoelectric constants $d_{33}$ and $d_{31}$ of the (111) oriented piezoelectric ceramics are increased compared with the piezoelectric constant of the ceramics having no orientation.

Further, it is preferred that the piezoelectric ceramics of the present invention have a Lotgering factor F, which indicates a degree of (111) orientation of the piezoelectric ceramics, of 0.10 or more to 1.00 or less in an X-ray diffraction method. The lower limit value of the Lotgering factor F is more preferably 0.15. There are some indexes indicating the degree of orientation, but the Lotgering factor F is used herein. If the Lotgering factor F is larger than 0, this means that the target crystal plane is oriented.

If the Lotgering factor F is smaller than 0.10, there are few effective domains that can contribute to a piezoelectric effect, and an increase of the piezoelectric constant with respect to the non-oriented (randomly oriented) state is not sufficient. In addition, as the Lotgering factor F approaches 1.00, the effective domains that can contribute to the piezoelectric effect increase, and hence the piezoelectric constant of the piezoelectric ceramics is increased. If the Lotgering factor F is 1.00, a peak to be detected is only a diffraction peak from the target crystal plane. In other words, all the crystals at levels that can be detected by the X-ray diffraction method are aligned and oriented in a target orientation. The Lotgering factor F is calculated by 2θ-θ measurement of the X-ray diffraction. In the range of 2θ from 10 to 85 degrees, the Lotgering factor F is calculated by the equation (1) using an integral peak intensity of the X-ray diffracted from the target crystal plane.

$$F=(\rho-\rho_0)/(1-\rho_0) \qquad (1)$$

Here, $\rho_0$ is calculated by using an X-ray diffraction intensity ($I_0$) of a non-oriented sample, and in the case of the (111) orientation, it is determined by the equation (2) as a ratio of a sum of diffraction intensities of the (111) plane and a (222) plane to a total sum of all diffraction intensities.

$$\rho_0=\Sigma I_0(111)/\Sigma I_0(hkl) \qquad (2)$$

Further, ρ is calculated by using an X-ray diffraction intensity (I) of an orientation sample, and in the case of the (111) orientation, it is determined by the equation (3) similarly to the equation (2) as a ratio of a sum of diffraction intensities of the (111) plane and the (222) plane to a total sum of all diffraction intensities.

$$\rho=\Sigma I(111)/\Sigma I(hkl) \qquad (3)$$

In the general formula (1), it is preferred that the range of x representing abundance of $BaTiO_3$ satisfy $0.40 \leq x \leq 0.80$. More preferably, $0.50 \leq x \leq 0.75$ is satisfied. If x is smaller than 0.40, the effect of increase of the piezoelectric constant due to the orientation is decreased. In addition, a crystal phase other than the perovskite-type structure (hereinafter, this crystal phase is referred to as "impurity phase") may be generated. On the other hand, if x is larger than 0.80, the Curie temperature becomes lower than 160° C., and hence the piezoelectric property may disappear due to depolarization in a high temperature region. In addition, by setting x to a value in the above-mentioned range, room temperature phase transition unique to barium titanate constituting the piezoelectric ceramics is eliminated so that piezoelectric performance in a practical temperature region becomes stable.

In this specification, the Curie temperature refers to the temperature at which ferroelectricity disappears. As a method of specifying the Curie temperature, there are a method of directly measuring the temperature at which ferroelectricity disappears while changing a measuring temperature, and a method in which a dielectric constant is measured by using a micro alternating electric field of a certain frequency while changing a measuring temperature to thereby determine the temperature at which the dielectric constant becomes maximum.

A desirable Curie temperature in the piezoelectric ceramics of the present invention is 160° C. or more to 500° C. or less, more preferably, 200° C. or more to 450° C. or less. If the Curie temperature is 160° C. or more, it is possible to provide a piezoelectric ceramics with little characteristic variation due to a change in temperature when the ceramics are used in a device. In addition, if the Curie temperature is 500° C. or less, it is possible to provide a piezoelectric ceramics that are easily subjected to polarization treatment when the ceramics are used in an element.

In the general formula (1), it is preferred that the range of y representing abundance of $BiFeO_3$ satisfy $0 \leq y \leq 0.30$. More preferably, $0.05 \leq y \leq 0.30$ is satisfied. If y is larger than 0.30, not only the (111) orientation but also a (110) orientation is mixed, and hence the effect of the increase of the piezoelectric constant is decreased.

In the general formula (1), it is preferred that the range of z representing abundance of $Bi(M_{0.5}Ti_{0.5})O_3$ satisfy $0.05 \leq z \leq 0.60$. More preferably, $0.05 \leq z \leq 0.55$ is satisfied. If z is smaller than 0.05, there occurs a problem for the following reason, regardless of what value x takes. Specifically, if z is smaller than 0.05 and x is 0.5 or more, the Curie temperature may be decreased. In addition, if x is smaller than 0.5, the insulation property may be deteriorated. On the other hand, if z is larger than 0.60, the impurity phase may occur to thereby decrease the piezoelectric performance.

In the general formula (1), if $0.40 \leq x \leq 0.80$, $0 \leq y \leq 0.30$, and $0.05 \leq z \leq 0.60$ are satisfied, it can be said that x, y, and z are within the range surrounded by the following coordinate points A, B, C, D, and E.

The values (x, y, z) of the respective coordinate points are as follows.

A: (x, y, z)=(0.80, 0.00, 0.20)
B: (x, y, z)=(0.80, 0.15, 0.05)
C: (x, y, z)=(0.65, 0.30, 0.05)
D: (x, y, z)=(0.40, 0.30, 0.30)
E: (x, y, z)=(0.40, 0.00, 0.60)

FIG. 1 is a triangle phase diagram illustrating a composition range of the piezoelectric ceramics according to the present invention. Black dots and thick full lines indicate a region included in the composition range of the present invention. The part surrounded by the coordinate points A, B, C, D, E, and A is the composition range of the piezoelectric ceramics according to the present invention, which exhibits excellent piezoelectric performance and a high Curie temperature. For instance, the composition range has a piezoelectric constant $d_{33}^*$ of 105 (pm/V) or more and the Curie temperature of 160° C. or more. In this specification, the piezoelectric constant $d_{33}^*$ is a constant determined from a gradient of an electric field and a distortion of an electric field distortion curve. Here, mark * is added for the following reason. The piezoelectric constant $d_{33}$ that is usually used shows piezoelectric property only in a 33-direction. In contrast, in this calculation method, there is a slight possibility of contribution to directions other than the 33-direction.

In the general formula (1), it is preferred that M in $Bi(M_{0.5}Ti_{0.5})O_3$ be at least one type of element selected from the group consisting of Mg and Ni. The element M may be only Mg, or may be only Ni, or may contain both Mg and Ni. Mg and Ni are elements stable in divalent and can form quasi-trivalent ions with tetrad Ti. When the quasi-trivalent ions occupy the B-site, it is possible to achieve charge balance with trivalent Bi occupying the A-site. Therefore, it is preferred that a ratio between M and Ti be 1:1 ideally. As to the general formula (1), element amounts of M and Ti in $Bi(M_{0.5}Ti_{0.5})O_3$ are both 0.5. However, even if the amounts are varied from 0.5 to between 0.4 and 0.6, the advantageous effect of the present invention can be obtained as long as the metal oxide is in a single phase state constituted of only the perovskite-type structure.

In addition, the piezoelectric ceramics of the present invention may include property modifier or impurity components resulting from raw materials and the manufacturing process within a range of 1 mass %.

As to the piezoelectric ceramics according to the present invention, it is preferred that the piezoelectric ceramics contain at least one type of element selected from the group consisting of manganese (Mn) and copper (Cu) at 0.05 mass % or more to 3.0 mass % or less.

The piezoelectric ceramics of the present invention contains at least one type selected from the group consisting of Mn and Cu, and hence insulation property and a density of the piezoelectric ceramics are improved. If the insulation property of the piezoelectric ceramics is improved, it is possible to endure polarization treatment in which a high electric field is applied. Thus, conversion efficiency between electric energy and mechanical energy is improved. In addition, if the density of the piezoelectric ceramics is improved, piezoelectric property and mechanical strength are improved.

If the amount of at least one type of element selected from the group consisting of Mn and Cu is larger than 3.0 mass %, the impurity phase may be generated.

In addition, positions of Mn and Cu contained in the piezoelectric ceramics of the present invention are not limited particularly. Mn and Cu may be contained at the B site of the perovskite-type structure or may be contained as an oxide at a crystal grain boundary so that the same effect can be expected.

As to the piezoelectric ceramics according to the present invention, it is preferred that an average equivalent circular diameter of crystal grains of the ceramics be 500 nm or more to 5 μm or less, and that a maximum equivalent circular diameter of the crystal grains be 5 μm or more to 10 μm or less.

The "equivalent circular diameter" used herein refers to a "projected area equivalent circular diameter" that is generally mentioned in a microscopic observation method and indicates a diameter of a circle having the same area as a projected area of the crystal grain. In the present invention, this method of measuring the equivalent circular diameter is not limited particularly. For instance, the equivalent circular diameter can be determined by photographing a surface of the piezoelectric ceramics using a polarizing microscope or a scanning electron microscope, and by performing image processing on the obtained photographic image. An enlarging magnification when the equivalent circular diameter of the +crystal grain is determined is, for example, approximately 5 to 5,000. An optical microscope and an electron microscope may be used selectively depending on the magnification. It is possible to determine the equivalent circular diameter not from an image of a surface of the baked ceramics but from an image of a polished surface or a cross-section.

The "average equivalent circular diameter" used herein refers to an average value of the equivalent circular diameter obtained by performing image processing on the photographic image obtained by photographing the piezoelectric ceramics. The average value may be a volume average or a number average, but the number average is preferred.

The "maximum equivalent circular diameter" used herein refers to a maximum value of the equivalent circular diameter obtained by performing image processing on the photographic image obtained by photographing the piezoelectric ceramics.

If the average equivalent circular diameter of the crystal grains is 500 nm or more to 5 μm or less, good piezoelectric property and mechanical strength of the piezoelectric ceramics can be obtained. On the other hand, if the average equivalent circular diameter is smaller than 500 nm, the density may be decreased so that sufficient piezoelectric property cannot be obtained. In addition, if the average equivalent circular diameter is larger than 5 μm, mechanical strength may be insufficient for practical driving of the device.

In addition, if the maximum equivalent circular diameter of the crystal grains is 5 μm or more to 10 μm or less, good piezoelectric property and mechanical strength of the piezoelectric ceramics can be obtained. On the other hand, if the maximum equivalent circular diameter is smaller than 5 μm, the density may be decreased so that sufficient piezoelectric property cannot be obtained. In addition, if the maximum equivalent circular diameter is larger than 10 μm, mechanical strength may be insufficient for practical driving of the device.

Next, a method of manufacturing a piezoelectric ceramics of the present invention is described.

The method of manufacturing a piezoelectric ceramics according to the present invention includes obtaining slurry containing at least hexagonal barium titanate, placing the slurry on a substrate, applying a magnetic field to the slurry so as to obtain a compact, and performing oxidation treatment of the compact.

In hexagonal barium titanate (6H type), the axis of easy magnetization is a c-axis. Therefore, by filling the slurry containing a hexagonal barium titanate crystal into a plaster mold placed in a vertical magnetic field (slip casting), the compact containing c-axis-oriented hexagonal barium titanate can be obtained. An atom stacked formation of the hexagonal barium titanate crystal in the c-axis direction is similar to an atom stacked formation of the perovskite structure crystal, which is expressed generally by $ABO_3$, in the <111> direction. Therefore, through oxidation treatment of the compact containing c-axis-oriented hexagonal barium titanate, the compact can be changed into a crystal structure having the (111) oriented perovskite structure. Simultaneously with this oxidation treatment, or before or after the oxidation treatment, a solid solution having a component other than barium titanate is formed so that a piezoelectric ceramics containing the (111) oriented perovskite-type metal oxide as the whole metal oxide can be obtained. Good piezoelectric property due to the engineered domain structure can be expected in the (111) oriented piezoelectric ceramics.

Hexagonal barium titanate can be obtained by keeping tetragonal barium titanate in hydrogen atmosphere at a temperature from 1,400° C. to 1,500° C. It is possible to perform thermal treatment after reduction treatment under a condition in which a hexagonal system does not change. Alternatively, it is possible to keep barium titanate, which has the tetragonal structure at room temperature, in the air at approximately 1,500° C. or higher so that the phase transition to hexagonal barium titanate occurs, and then to rapidly cool hexagonal barium titanate after the phase transition so that barium titanate having the hexagonal structure at room temperature can be obtained.

In addition, hexagonal barium titanate may contain at least one type of element selected from the group consisting of manganese (Mn) and copper (Cu) in the crystal structure. For instance, there are hexagonal crystals such as $BaTi_{0.9}Mn_{0.05}O_{3+\beta}$ and $BaTi_{0.9}Cu_{0.05}O_{2.85}$. These crystals are produced by a solid phase reaction of barium carbonate, titanium oxide, manganese monoxide, copper oxide, or the like. Barium titanate is usually produced by the solid phase reaction, but may be produced by another method superior in mass production and particle size control, such as a hydrothermal synthesis method or an oxalic acid method.

In order to produce the slurry containing hexagonal barium titanate, hexagonal barium titanate is crushed into particles as necessary. The same applies to inorganic components other than hexagonal barium titanate. If the particles are too large, the particles settle in the slurry and therefore do not contribute to the orientation. On the contrary, if the particles are too small, the particles are flocculated in the slurry and therefore do not contribute to the orientation as well. In order to achieve an appropriately dispersed state in the slurry, an average diameter of the particles is preferably 10 nm or more to 10 μm or less, and more preferably 50 nm or more to 1 μm or less. An average particle diameter and particle size distribution in the slurry can be measured by dynamic light scattering, for example.

In order to obtain the piezoelectric ceramics of the present invention, a raw material of a metal element such as Bi, Fe, Mg, Ni, or Ti besides hexagonal barium titanate are added to the slurry. A raw material of a metal element such as Ba, Cu, or Mn may be added as necessary. The raw material of the metal element includes a metallic compound such as a barium (Ba) compound, a titanium (Ti) compound, a bismuth (Bi) compound, an iron (Fe) compound, a magnesium (Mg) compound, a nickel (Ni) compound, an Mn compound, or a Cu compound. In addition, a composite metal oxide such as bismuth ferrite or bismuth titanate may be used as the raw material. In order to manufacture the composite metal oxide, it is possible to use a general method of sintering solid powder of an oxide, a carbonate, a nitrate, an oxalate, or the like at a normal pressure. As the Ba compound that can be used, there are barium oxide, barium carbonate, barium oxalate, barium acetate, barium nitrate, barium titanate, and the like. Examples of the Ti compound that can be used include titanium oxide and the like. Examples of the Bi compound that can be used include bismuth oxide, bismuth nitrate, and the like. Examples of the Fe compound that can be used include iron oxide, iron chloride, iron nitrate, and the like. Examples of the Mg compound that can be used include magnesium oxide, magnesium oxalate, magnesium chloride, magnesium carbonate, and the like. Examples of the Ni compound that can be used include nickel oxide, nickel nitrate, nickel chloride, nickel oxalate, and the like. Examples of the Mn compound that can be used include manganese carbonate, manganese monoxide, manganese dioxide, manganese acetate, and the like. Examples of the Cu compound that can be used include copper oxide, copper nitrate, copper sulfate, and the like.

The slurry contains a solvent as well as particle components including hexagonal barium titanate as the main component and another metal compound. The slurry may further contain a dispersing agent, an antifoaming agent, an electrifying agent, and the like as necessary. For instance, in order to produce the compact containing hexagonal barium titanate by slip casting, a preferred solvent is water from viewpoints of safety, cost, and surface tension. In the weight of the slurry, a ratio of hexagonal barium titanate and the another metal compound to the solvent is preferably 40 to 80 wt %. If the ratio of the particles to the solvent is too large, a viscosity of the slurry becomes excessively large so that smooth orientation of the particles in the magnetic field is inhibited. In addition, if the ratio of the particles to the solvent is too small, a large amount of slurry is needed to obtain the compact having a desired thickness, which is impractical.

It is preferred that the particles dispersed in the slurry not be flocculated. If the particles are flocculated, magnetic anisotropy of individual particles are canceled out among one another so that the orientation of the crystal particles in the magnetic field is inhibited. In addition, it is preferred that the viscosity of the slurry be small. This is because, if viscosity of the slurry is low, the dispersed particles can be easily rotated by torque applied from the magnetic field. For the purpose of improving dispersion property of the particles or reducing the viscosity of the slurry, it is possible to add an organic component such as a dispersing agent or a surface active agent to the slurry. In addition, in order to increase the density of the piezoelectric ceramics, it is possible to add an organic binder. Further, in order to use electrophoresis as a method of producing the compact, it is possible to add an electrifying agent to the slurry.

Next, in order to produce the compact, the slurry is placed on the substrate so that the particles are deposited. The substrate may have a flat plate-like shape or a container-like shape. In order to obtain a concretion of the placed and deposited slurry in a desired shape, it is preferred to use a substrate having a recess formed therein. In addition, in order to promote drying, it is preferred that the substrate be made of a material absorbing the solvent. In particular, it is preferred that the substrate of the present invention be made of plaster. As a method of placing the slurry on the substrate, it is preferred to slowly pour the slurry in the recess or the like formed in the substrate.

In order to obtain the compact, it is preferred to naturally dry the slurry coagulated on the substrate at room temperature. It is preferred that the drying temperature be lower than 40° C. Drying by heating at a temperature of 60° C. or more using a drier is not preferred because a crack is apt to occur in the compact. The crack in the present invention refers to a large crack that can be seen by the naked eye. If there is a crack in the ceramics as a functional material, there occurs a problem of deterioration of mechanical strength as well as deterioration of the performance itself.

Placing of the slurry and application of the magnetic field to the slurry may be performed in series or may be performed simultaneously. In order to produce the compact in a shorter time, slip casting or electrophoresis in the magnetic field can be used. With the slip casting, the compact having an arbitrary shape and a high density can be obtained. With the electrophoresis, a compact sheet can be obtained on the electrode dipped in the slurry. It is possible to manufacture a multilayered piezoelectric element by alternately stacking the compact sheets and electrodes.

In the description of the present invention, a case where the direction of growing the compact in the magnetic field is parallel to the magnetic field is mainly described. However, an angle between the magnetic field and the depositing direction can be changed arbitrarily in accordance with an orientation of a crystal to be produced.

As an intensity of the applied magnetic field is larger, a larger effect of the orientation can be obtained. However, if the magnetic field intensity is too large, a facility for generating and shielding the magnetic field is upsized. On the contrary, if the magnetic field intensity is too small, the effect of orientation becomes small. Therefore, it is preferred that the magnetic field intensity be 1 Tesla (T) or more to 15 T or less. It is preferred to use a superconducting magnet apparatus as means for generating and applying the magnetic field.

Next, oxidation treatment of the compact is performed so that solid-solution treatment of the particles and crystal structure transformation are performed. The oxidation treatment refers to, for example, treatment of applying heat to the compact in oxygen-containing atmosphere such as the air. It is preferred that the oxygen containing atmosphere be atmosphere containing oxygen at a concentration of 18 vol % or more. It is preferred that the thermal treatment be performed at a temperature of 400 to 1,450° C. maintained for 10 minutes or longer. A more preferred temperature of the thermal treatment is 800° C. or more to 1,150° C. or less. A still more preferred temperature is 900° C. or more to 1,030° C. or less. A preferred time of the thermal treatment is 1 hour or more to 24 hours or less under a state in which the temperature is kept constant in the above-mentioned range. The piezoelectric ceramics having subjected to the thermal treatment in the temperature range and the time range described above exhibits good piezoelectric property. This oxidation treatment may also serve as a sintering step that is usually performed in a process of producing ceramics.

Between before and after the oxidation treatment, the compact may undergo the following changes, singly or in plurality. (I) A crystal system is changed. (II) A weight is increased. (III) A reflection factor increases when light having a wavelength of 400 to 500 nm is irradiated. (IV) An electric resistivity is increased. In addition, the thermal treatment method is not limited particularly. Examples of the thermal treatment method include a sintering method using an electric furnace, an electric heating method, a microwave sintering method, a millimeter wave sintering method, and a hot isostatic pressing (HIP) method.

A relative density of the sintered piezoelectric ceramics is preferably 90% or more, more preferably 95% or more. This is because, if the relative density is lower than 90%, a relative dielectric constant of the piezoelectric ceramics is conspicuously decreased, and the mechanical strength is also decreased. An example of means for increasing the relative density includes a method of adding manganese or copper.

Figure 2:
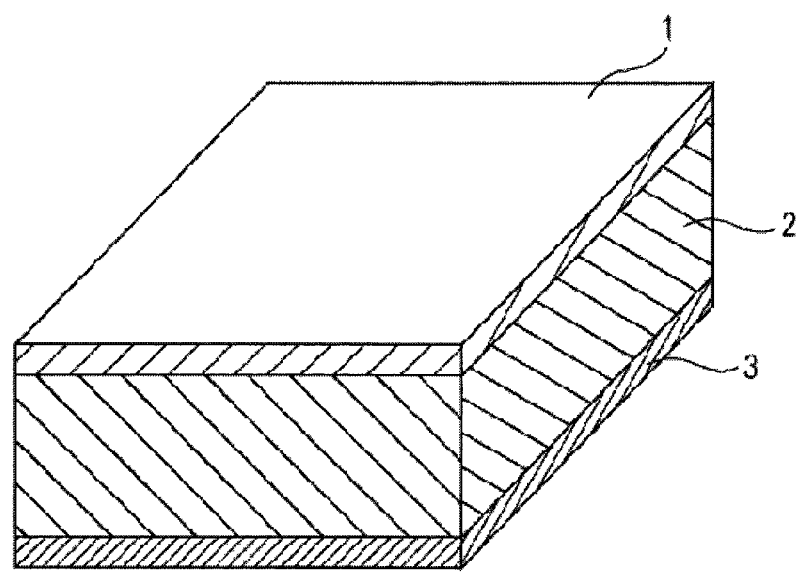
FIG. 2 is a schematic view showing a piezoelectric element according to an embodiment of the invention.

Hereinafter, a piezoelectric element using the piezoelectric ceramics of the present invention is described. FIG. 2 is a schematic view showing a piezoelectric element according to one embodiment of the present invention. The piezoelectric element of the present invention includes at least: a first electrode 1; a piezoelectric ceramics 2; and a second electrode 3, and the piezoelectric ceramics 2 contained in the piezoelectric element is the piezoelectric ceramics of the present invention. It is possible to obtain a multilayered piezoelectric element having three layers of electrodes.

The first electrode 1 and the second electrode 3 are each formed of a conductive layer having a thickness of about 5 nm to 2,000 nm. The material for the conductive layer is not particularly limited, and may be a material which is typically used in a piezoelectric element. Examples of such material include metals such as Ti, Pt, Ta, Ir, Sr, In, Sn, Au, Al, Fe, Cr, Ni, Pd, Ag, and Cu, and compounds of these metals. Each of the first electrode 1 and the second electrode 3 may be formed of one kind of those materials, or may be obtained by laminating two or more kinds thereof. The first electrode 1 and the second electrode 3 may be formed of different materials, respectively.

A method of manufacturing the first electrode 1 and the second electrode 3 is not limited. The first electrode 1 and the second electrode 3 may be formed by baking a metal paste or by sputtering, vapor deposition, or the like. In addition, both the first electrode 1 and the second electrode 3 may be patterned in desired shapes for use.

The piezoelectric element may have polarization axes oriented in a particular direction. When polarization axes are oriented in a particular direction, the piezoelectric constant of the piezoelectric element is increased. The polarization method for the piezoelectric element is not particularly limited. The polarization treatment may be conducted in air or in silicone oil. The temperature during polarization may be 60° C. to 150° C. but optimum conditions slightly vary depending on the composition of the piezoelectric ceramic constituting the device. The electric field applied to conduct the polarization treatment may be 800 V/mm to 3.0 kV/mm. The piezoelectric constant and mechanical quality factor of the piezoelectric element can be calculated from a resonant frequency and an antiresonant frequency measured with a commercially available impedance analyzer on the basis of Electronic Materials Manufacturers Association of Japan Standard (EMAS-6100).

A liquid discharge head according to an embodiment of the present invention includes at least a discharge port in communication with a liquid reservoir equipped with a vibrating unit that includes a piezoelectric element or multilayered piezoelectric element.

Figure 3A:
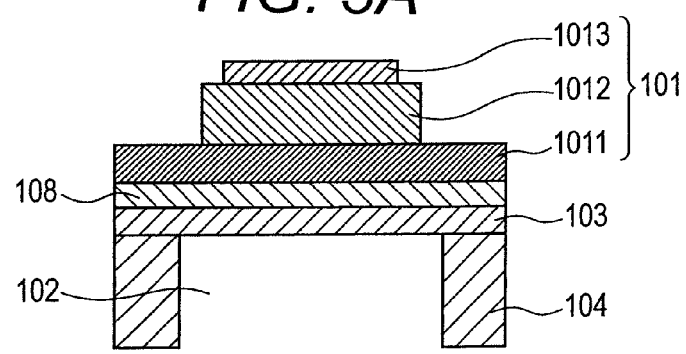
FIGS. 3A and 3B are schematic diagrams illustrating a structure of a liquid discharge head according to an embodiment of the present invention.
Figure 3B:
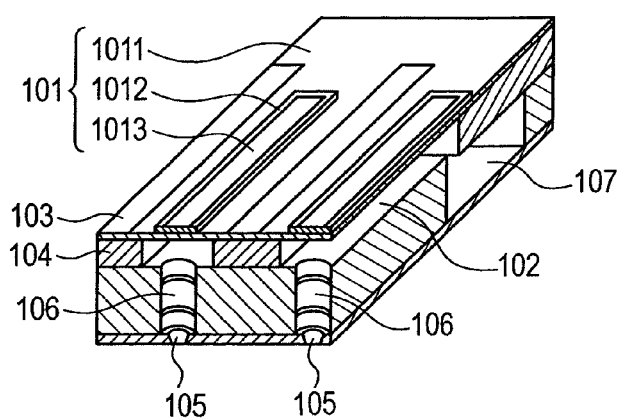

FIGS. 3A and 3B are schematic diagrams illustrating a structure of a liquid discharge head according to the embodiment of the present invention. As illustrated in FIGS. 3A and 3B, the liquid discharge head of the present invention is a liquid discharge head including a piezoelectric element 101 of the present invention. The piezoelectric element 101 is a piezoelectric element including at least a first electrode 1011, a piezoelectric ceramics 1012, and a second electrode 1013. The piezoelectric ceramics 1012 is patterned as required as illustrated in FIG. 3B.

FIG. 3B is a schematic diagram of the liquid discharge head. The liquid discharge head includes ejection ports 105, individual liquid chambers 102, communicating holes 106 for connecting the individual liquid chambers 102 and the ejection ports 105, liquid chamber partition walls 104, a common liquid chamber 107, a diaphragm 103, and the piezoelectric elements 101. Each of the piezoelectric elements 101, which is of a rectangular shape in FIG. 3B, may be of a shape besides the rectangular shape such as an elliptical shape, a circular shape, or a parallelogram shape. In general, the piezoelectric ceramics 1012 are each of a shape in conformity with the shape of the individual liquid chamber 102.

The vicinity of the piezoelectric element 101 included in the liquid discharge head of the present invention is described in detail with reference to FIG. 3A. FIG. 3A is a sectional view of the piezoelectric element in the width direction of the liquid discharge head illustrated in FIG. 3B. The sectional shape of the piezoelectric element 101, which is illustrated in a rectangular shape, may be a trapezoidal shape or a reverse trapezoidal shape. In FIG. 3A, the first electrode 1011 is used as the lower electrode, and the second electrode 1013 is used as the upper electrode. However, the arrangement of the first electrode 1011 and the second electrode 1013 is not limited to the foregoing. For example, the first electrode 1011 may be used as the lower electrode, or may be used as the upper electrode. Similarly, the second electrode 1013 may be used as the upper electrode, or may be used as the lower electrode. In addition, a buffer layer 108 may be present between the diaphragm 103 and the lower electrode.

Note that, those differences in name are caused by a manufacturing method for the device and an advantageous effect of the present invention can be obtained in any case.

In the liquid discharge head, the diaphragm 103 vertically fluctuates owing to the expansion and contraction of the piezoelectric ceramics 1012 to apply a pressure to liquid in the individual liquid chamber 102. As a result, the liquid is discharged from the ejection port 105. The liquid discharge head of the present invention can be used in a printer application or the manufacture of an electronic device.

The diaphragm 103 has a thickness of 1.0 µm or more to 15 µm or less, preferably 1.5 pm or more to 8 µm or less. A material for the diaphragm, which is not limited, is preferably Si. Si for the diaphragm may be doped with B or P. In addition, the buffer layer and the electrode layer on the diaphragm may serve as part of the diaphragm.

The buffer layer 108 has a thickness of 5 nm or more to 300 nm or less, preferably 10 nm or more to 200 nm or less.

The size of the ejection port 105 is 5 µm or more to 40 µm or less in terms of a equivalent circular diameter. The shape of the ejection port 105 may be a circular shape, or may be a star shape, a square shape, or a triangular shape.

A liquid discharge apparatus according to an embodiment of the present invention will now be described. The liquid discharge apparatus includes the liquid discharge head described above.

Figure 4:
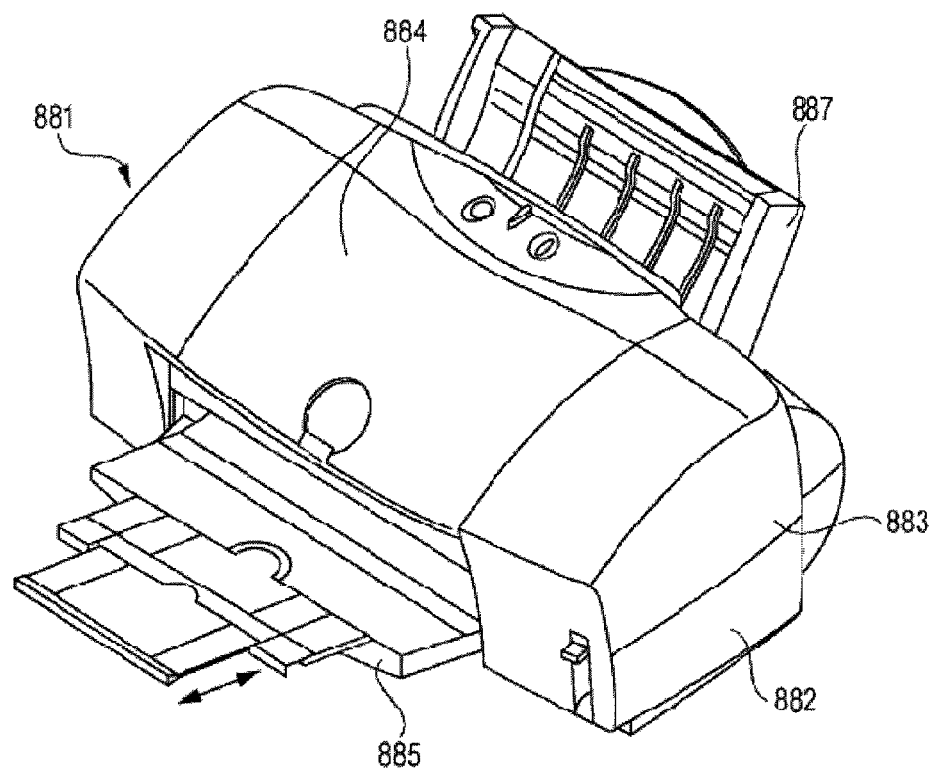
FIG. 4 is a schematic view showing a liquid discharge apparatus according to an embodiment of the invention.
Figure 5:
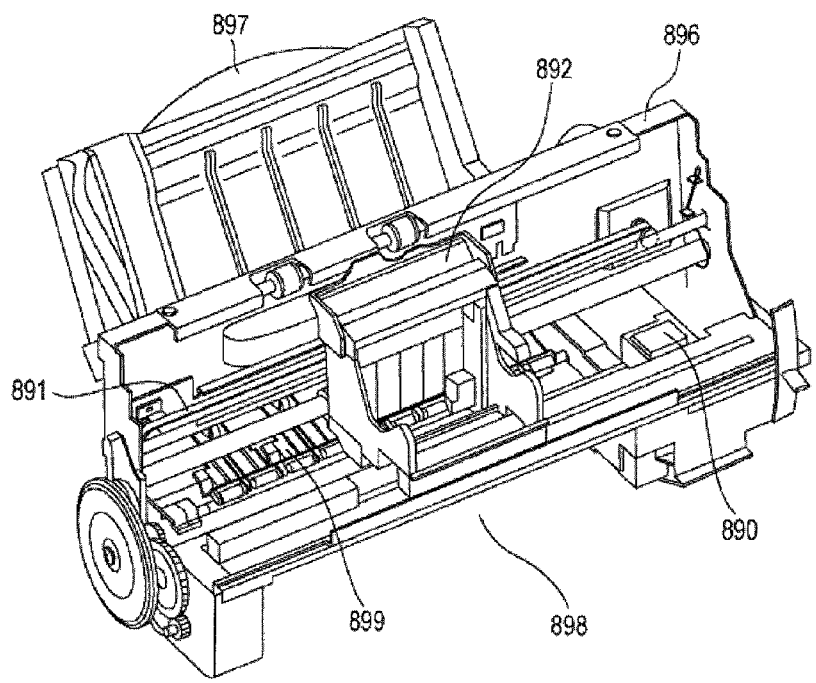
FIG. 5 is another schematic view showing the liquid discharge apparatus.

An example of the liquid discharge apparatus is an ink jet recording apparatus shown in FIGS. 4 and 5. FIG. 5 shows the state in which outer casings 882 to 885 and 887 are removed from a liquid discharge apparatus (ink jet recording apparatus) 881 shown in FIG. 4. The ink jet recording apparatus 881 includes an automatic feeding unit 897 configured to automatically feed a recording paper sheet, i.e., a recording medium, into a main body 896. The ink jet recording apparatus 881 also includes a transport unit 899 that guides the recording sheet fed from the automatic feeding unit 897 to a particular recording position and to a discharge slot 898 from the recording position, a recording unit 891 configured to conduct recording on the recording sheet transferred to the recording position, and a recovery unit 890 configured to conduct a recovery process on the recording unit 891. The recording unit 891 has a carriage 892 that houses the liquid discharge head and moves on a rail in a reciprocating manner.

When an electric signal is input to this ink jet recording apparatus from a computer, the carriage 892 moves on the rail and a driving voltage is applied to the electrodes sandwiching the piezoelectric material so that the piezoelectric material undergoes deformation. This deformation of the piezoelectric material pressurizes the individual liquid reservoir 102 via the vibrating plate 103 and causes ink to be ejected from the discharge port 105, thereby conducting printing.

This liquid discharge apparatus can eject liquid uniformly at a high speed and is small-sized.

Although an example of a printer is described above, the liquid discharge apparatus may be used in industrial liquid discharge apparatuses and drawing apparatuses configured to draw images, characters, etc., on media in addition to printing apparatus such as facsimile machines, multifunction apparatuses, and ink jet recording apparatuses.

Next, an ultrasonic motor using the piezoelectric element of the present invention is described.

An ultrasonic motor according to an embodiment of the present invention includes at least a moving member that contacts a vibrating member equipped with a piezoelectric material or multilayered piezoelectric element.

Figure 6A:
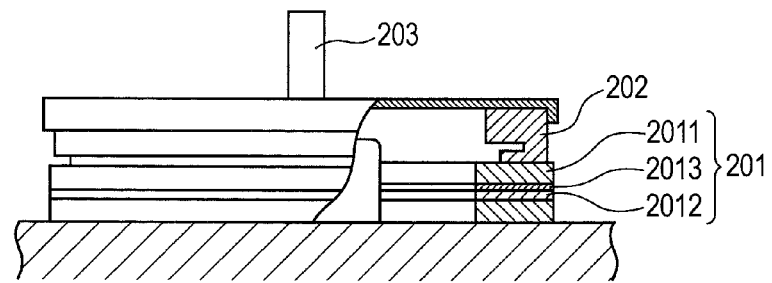
FIGS. 6A and 6B are schematic diagrams illustrating a structure of an ultrasonic motor according to the embodiment of the present invention.
Figure 6B:
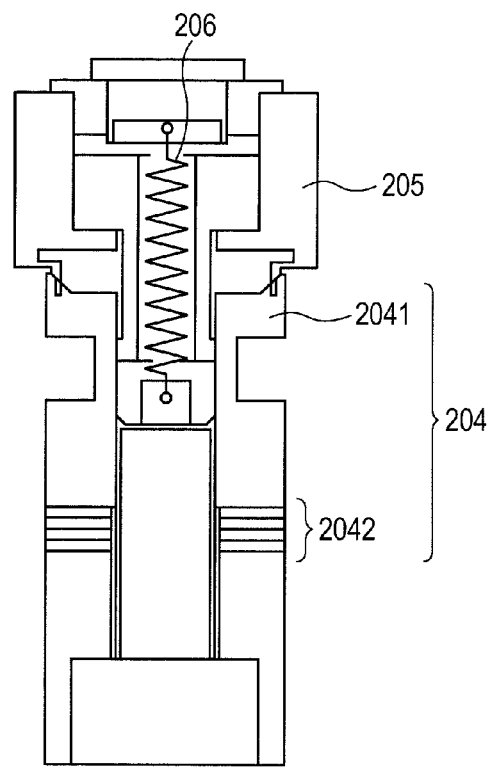

FIGS. 6A and 6B are schematic diagrams illustrating a structure of the ultrasonic motor according to the embodiment of the present invention.

FIG. 6A illustrates an ultrasonic motor in which the piezoelectric element of the present invention is formed of a single plate. The ultrasonic motor includes a oscillator 201, a rotor 202 brought into contact with the sliding surface of the oscillator 201 by virtue of a pressure applied from a pressurizing spring (not shown), and an output axis 203 provided so as to be integral with the rotor 202. The oscillator 201 is formed of a metal elastic ring 2011, a piezoelectric element 2012 of the present invention, and an organic adhesive 2013 for bonding the piezoelectric element 2012 to the elastic ring 2011 (such as an epoxy- or cyanoacrylate-based adhesive). The piezoelectric element 2012 of the present invention is formed of a piezoelectric ceramics interposed between a first electrode (not shown) and a second electrode (not shown).

The application of two alternating voltages different from each other in phase by $\pi/2$ to the piezoelectric element of the present invention results in the generation of a bending travelling wave in the oscillator 201, and hence each point on the sliding surface of the oscillator 201 undergoes an elliptical motion. When the rotor 202 is brought into press contact with the sliding surface of the oscillator 201, the rotor 202 receives a frictional force from the oscillator 201 to rotate in the direction opposite to the bending travelling wave. A body to be driven (not shown) is joined to the output axis 203, and is driven by the rotary force of the rotor 202.

The application of a voltage to the piezoelectric ceramics results in the expansion and contraction of the piezoelectric ceramics due to a piezoelectric transverse effect. When an elastic body such as a metal is joined to the piezoelectric element, the elastic body is bent by the expansion and contraction of the piezoelectric ceramics. The ultrasonic motor of the kind described here utilizes this principle.

Next, an ultrasonic motor including a piezoelectric element having a laminated structure is illustrated in FIG. 6B. A oscillator 204 is formed of a laminated piezoelectric element 2042 interposed between tubular metal elastic bodies 2041. The laminated piezoelectric element 2042 is an element formed of multiple laminated piezoelectric ceramics (not shown), and includes a first electrode and a second electrode on its outer surface of lamination, and inner electrodes on its inner surface of lamination. The metal elastic bodies 2041 are fastened with bolts so that the piezoelectric element 2042 may be interposed between and fixed by the bodies. Thus, the oscillator 204 is formed.

The application of alternating voltages different from each other in phase to the piezoelectric element 2042 causes the oscillator 204 to excite two vibrations orthogonal to each other. The two vibrations are synthesized to form a circular vibration for driving the tip portion of the oscillator 204. Note that, a constricted circumferential groove is formed in the upper portion of the oscillator 204 to enlarge the displacement of the vibration for driving.

A rotor 205 is brought into contact with the oscillator 204 under a pressure from a spring 206 for pressurization to obtain a frictional force for driving. The rotor 205 is rotatably supported by a bearing.

Next an optical apparatus according to an embodiment of the present invention is described. The optical apparatus includes an ultrasonic motor in a drive unit.

Figure 7A:
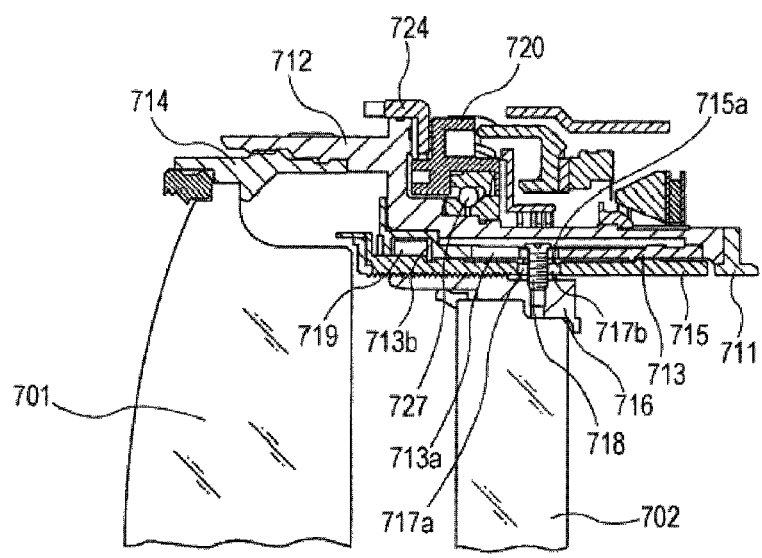
FIGS. 7A and 7B are schematic views showing an optical apparatus according to an embodiment of the invention.
Figure 7B:
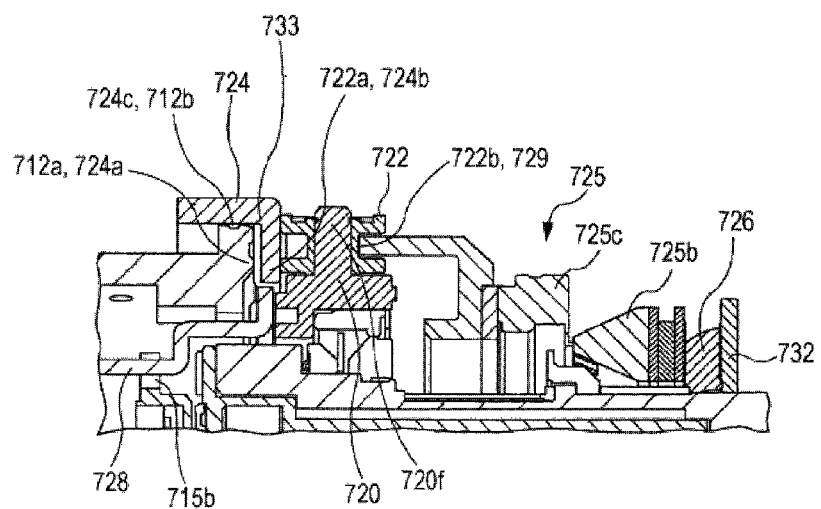
Figure 8:
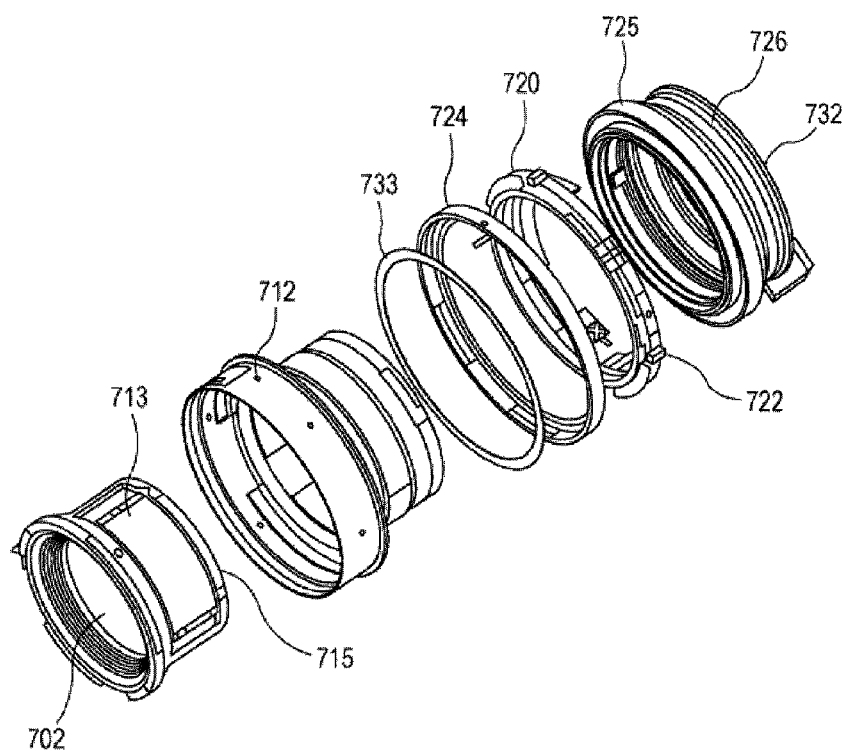
FIG. 8 is a schematic view showing the optical apparatus.

FIGS. 7A and 7B are each a cross-sectional view of a related part of a replaceable lens barrel of a single-lens reflex camera, which is an example of an imaging apparatus according to an embodiment of the present invention. FIG. 8 is an exploded perspective view of the replaceable lens barrel.

Referring to FIGS. 7A, 7B, and 8, a fixed barrel 712, linear guide barrel 713, and a front lens group barrel 714 are fixed to a mount 711 detachable from and attachable to a camera. These are fixed members of the replaceable lens barrel.

A linear guide groove 713a extending in an optical axis direction is formed in the linear guide barrel 713 to guide a focus lens 702. A cam roller 717a and a cam roller 717b protruding in an outer radial direction are fixed with a shaft screw 718 to a rear lens group barrel 716 holding the focus lens 702. The cam roller 717a is fitted in the linear guide groove 713a.

A cam ring 715 is rotatably fitted to the inner periphery of the linear guide barrel 713. Relative movements between the linear guide barrel 713 and the cam ring 715 in the optical axis direction is inhibited since a roller 719 fixed to the cam ring 715 is fitted in an annular groove 713b of the linear guide barrel 713. A cam groove 715a for the focus lens 702 is formed in the cam ring 715. The cam roller 717b is fitted in the cam groove 715a.

A rotation transmitting ring 720 is provided on the outer peripheral side of the fixed barrel 712. The rotation transmitting ring 720 is held by a ball race 727 so that it can rotate at a particular position relative to the fixed barrel 712. A roller 722 is rotatably held by a shaft 720f extending in a radial manner from the rotation transmitting ring 720, and a large-diameter portion 722a of the roller 722 is in contact with a mount-side end surface 724b of a manual focus ring 724. A small-diameter portion 722b of the roller 722 is in contact with a joint member 729. Six equally spaced rollers 722 are arranged on the outer periphery of the rotation transmitting ring 720 and each roller is configured to have the above-described relationship.

A low-friction sheet (washer member) 733 is arranged on the inner radial portion of the manual focus ring 724. The low-friction sheet 733 is interposed between a mount-side end surface 712a of the fixed barrel 712 and a front-side end surface 724a of the manual focus ring 724. The outer radial surface of the low-friction sheet 733 has a ring shape and is fitted in an inner radial portion 724c of the manual focus ring 724. The inner radial portion 724c of the manual focus ring 724 is fitted in an outer radial portion 712b of the fixed barrel 712. The low-friction sheet 733 reduces the friction in a rotary ring mechanism in which the manual focus ring 724 is rotated relative to the fixed barrel 712 about the optical axis.

The large-diameter portion 722a of the roller 722 and a mount-side end surface 724b of the manual focus ring 724 contact each other under pressure by being pressed by a wave washer 726 that presses an ultrasonic motor 725 toward the front side of the lens. The force from the wave washer 726 pressing the ultrasonic motor 725 toward the front side of the lens also causes the small-diameter portion 722b of the roller 722 and the joint member 729 to contact each other under an adequate degree of pressure. The wave washer 726 is confined from moving in the mount direction by a washer 732 bayonet-mounted to the fixed barrel 712. The spring force (urging force) generated by the wave washer 726 is transmitted to the ultrasonic motor 725 and to the roller 722 and serves as thrusting force of the manual focus ring 724 against the mount-side end surface 712a of the fixed barrel 712. In other words, the manual focus ring 724 is assembled while being urged against the mount-side end surface 712a of the fixed barrel 712 via the low-friction sheet 733.

Accordingly, when the ultrasonic motor 725 is driven and rotated with respect to the fixed barrel 712 by a controlling unit not shown in the drawing, the roller 722 rotates about the center of the shaft 720f because the joint member 729 makes frictional contact with the small-diameter portion 722b of the roller 722. As the roller 722 rotates about the shaft 720f, the rotation transmitting ring 720 is rotated about the optical axis (automatic focusing operation).

When rotation force about the optical axis is applied to the manual focus ring 724 from a manual operation input unit not shown in the drawing, the roller 722 rotates about the shaft 720f since the mount-side end surface 724b of the manual focus ring 724 is in pressure-contact with the large-diameter portion 722a of the roller 722. As the large-diameter portion 722a of the roller 722 rotates about the shaft 720f, the rotation transmitting ring 720 is rotated about the optical axis. The ultrasonic motor 725 at this time is prevented from rotating due to the frictional retention force of a rotor 725c and a stator 725b (manual focusing operation).

Two focus keys 728 are installed in the rotation transmitting ring 720 at positions opposite to each other and fitted in notches 715b at the front tip of the cam ring 715. When automatic focusing operation or manual focusing operation is conducted and the rotation transmitting ring 720 is rotated about the optical axis, the rotation force is transmitted to the cam ring 715 via the focus keys 728. When the cam ring 715 is rotated about the optical axis, a rear lens group barrel 716 inhibited from rotating due to the cam roller 717a and the linear guide groove 713a moves back and forth along the cam groove 715a in the cam ring 715 by the cam roller 717b. This drives the focus lens 702 and focusing operation is conducted.

Although a replaceable lens barrel of a single-lens reflex camera has been described as an example of the optical apparatus of the present invention, the range of the optical apparatus is not limited to this. The optical apparatus may be any type of camera such as a compact camera, an electronic still camera, or the like, or may be a portable information terminal equipped with a camera. An optical apparatus having an ultrasonic motor in a driver unit is also within the range of the present invention.

Figure 9A:
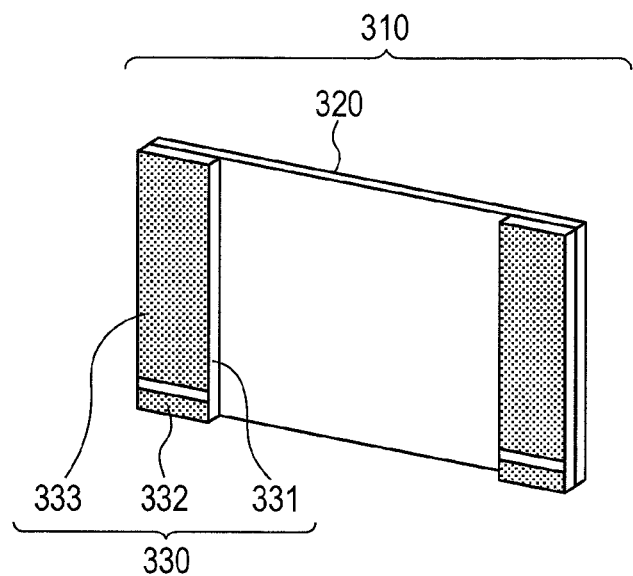
FIGS. 9A and 9B are schematic diagrams illustrating a case where the vibrarion generator according to the present invention is used for a dust removing device.
Figure 9B:
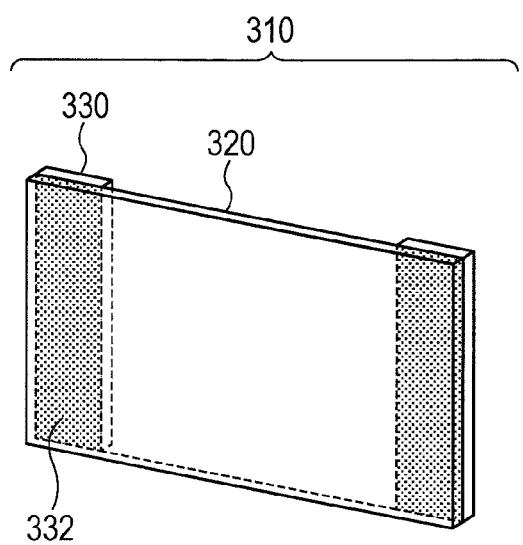

A vibration generator used for transportation and removal of paticle, powder and liquid is widely used in an electric apparatus. As one embodiment of the vibration generator according to the present invention, a dust removing device using the piezoelectric element of the present invention is described. The dust removing device according to the present invention is characterized by including a vibration body arranged the piezoelectric element or the multilayered piezoelectric element FIGS. 9A and 9B are schematic diagrams illustrating the dust removing device according to the present invention. A dust removing device 310 includes a plate-like piezoelectric element 330 and a diaphragm 320. The material of the diaphragm 320 is not limited. However, in the case where the dust removing device 310 is used for an optical device, a transparent material or a reflective material can be used as the material of the diaphragm 320. The piezoelectric element 330 includes a piezoelectric ceramics 331, a first electrode 332, and a second electrode 333.

FIGS. 10A to 10C are schematic diagrams illustrating a structure of the piezoelectric element 330 illustrated in FIGS. 9A and 9B. FIGS. 10A and 10C illustrate a front surface structure and a rear surface structure of the piezoelectric element 330, respectively. FIG. 10B illustrates a side surface structure.

As illustrated in FIGS. 10A to 10C, the piezoelectric element 330 includes the piezoelectric ceramics 331, the first electrode 332, and the second electrode 333. The first electrode 332 and the second electrode 333 are disposed so as to be opposed to the plate surfaces of the piezoelectric ceramics 331.

In FIG. 10C, the front surface of the piezoelectric element 330 on which the first electrode 332 is disposed is referred to as a first electrode surface 336. In FIG. 10A, the front surface of the piezoelectric element 330 on which the second electrode 333 is disposed is referred to as a second electrode surface 337.

Here, the electrode surface in the present invention refers to a surface of the piezoelectric element on which the electrode is disposed. For instance, as illustrated in FIGS. 10A to 10C, the first electrode 332 may extend around to the second electrode surface 337.

As illustrated in FIGS. 9A and 9B, as for the piezoelectric element 330 and the diaphragm 320, the plate surface of the diaphragm 320 is fixed to the first electrode surface 336 of the piezoelectric element 330. When the piezoelectric element 330 is driven, a stress is generated between the piezoelectric element 330 and the diaphragm 320, so that out-of-plane oscillation is generated in the diaphragm.

The dust removing device 310 of the present invention is a device that removes foreign matters such as dust sticking to the surface of the diaphragm 320 by the out-of-plane oscillation of the diaphragm 320. The out-of-plane oscillation means elastic vibration in which the diaphragm moves in the optical axis direction, namely in the thickness direction of the diaphragm.

FIGS. 11A and 11B are schematic diagrams illustrating a vibration principle of the dust removing device 310 of the present invention. FIG. 11A illustrates a state in which alternating electric fields having the same phase are applied to a pair of left and right piezoelectric elements 330 so that the out-of-plane oscillation is generated in the diaphragm 320.

The polarization direction of the piezoelectric ceramics forming the pair of left and right piezoelectric elements 330 is the same as the thickness direction of the piezoelectric elements 330, and the dust removing device 310 is driven by the seventh vibrational mode. FIG. 11B illustrates a state in which alternating voltages having opposite phases by 180 degrees are applied to the pair of left and right piezoelectric elements 330 so that the out-of-plane oscillation is generated in the diaphragm 320. The dust removing device 310 is driven by the sixth vibrational mode. The dust removing device 310 of the present invention is a device that can effectively remove dust sticking to the surface of the diaphragm by using at least two vibrational modes selectively.

Next, an imaging apparatus according to an embodiment of the present invention will now be described. The imaging apparatus according to the present invention includes the dust removing device and an image pickup element unit in which a vibration member of the dust removing device is provided on a side of a light receiving surface of the image pickup element unit.

Figure 12:
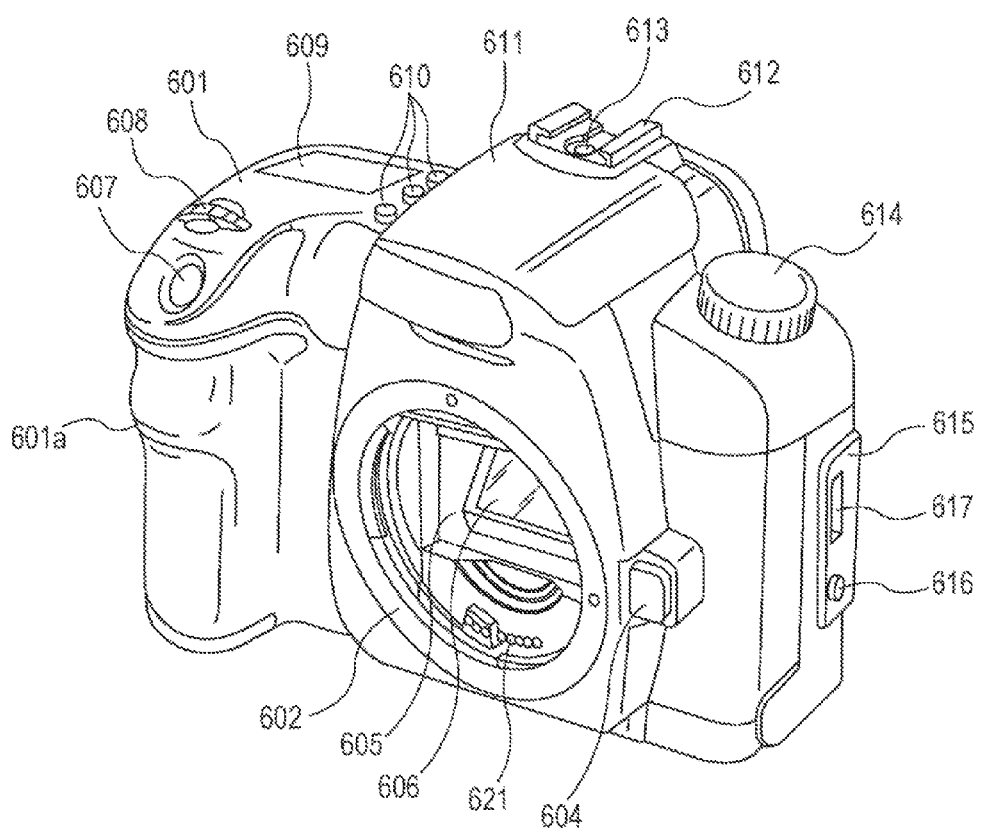
FIG. 12 is a schematic view showing an imaging apparatus according to an embodiment of the invention.
Figure 13:
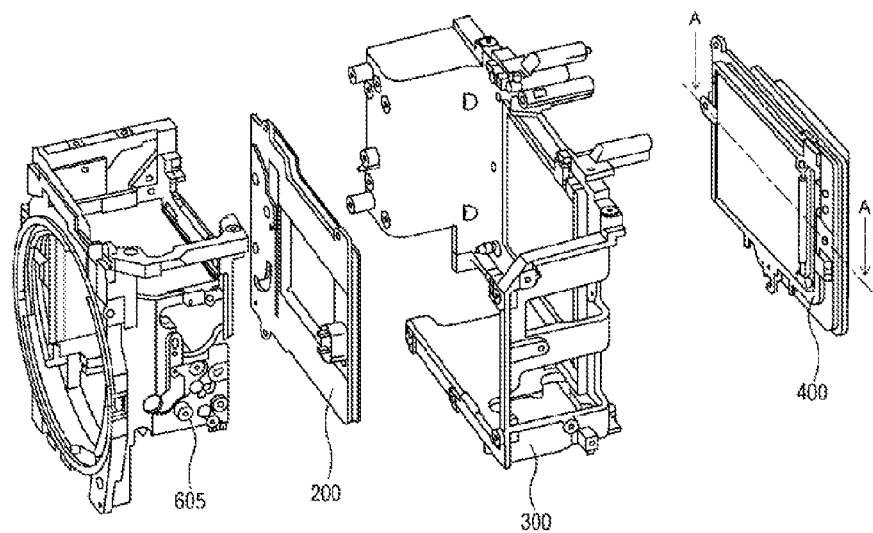
FIG. 13 is a schematic view showing the imaging apparatus.

FIGS. 12 and 13 illustrate a digital single lens reflex camera which is a preferred embodiment of the imaging apparatus of the present invention. FIG. 12 is a front side perspective view, viewing a camera body 601 from an object side, and shows a state where a taking lens unit is removed. FIG. 13 is an exploded perspective view illustrating an outline construction of the inside of the camera and explaining a peripheral structure of the dust removing device of the present invention and an image pickup unit 400.

A mirror box 605 to guide photographing luminous flux passed through the taking lens is provided inside the camera body 601. A main mirror (quick return mirror) 606 is arranged inside the mirror box 605. The main mirror 606 can obtain a state where an angle of 45° is maintained with respect to photographing optical axis in order to guide photographing luminous flux to a direction of a penta roof mirror (not shown) and a state where a position retracted from the photographing luminous flux in order to the photographing luminous flux to the image pickup device (not shown).

On the object side of body chassis 300 which comes to be a framework of the camera, the mirror box 605 and a shutter unit 200 are successively arranged from the object side. Further, the image pickup unit 400 is arranged on a photographer side of the body chassis 300. The image pickup unit 400 is provided with the photographing surface of image pickup element on a surface of installing the mount portion 602 which is standard for installing the photographing lens unit, with predetermined distance and in parallel.

The digital single lens camera has been explained as the imaging apparatus of the present invention. However, for example, a taking lens unit interchangeable camera such as a mirrorless type single lens camera without having the mirror box 605 is also acceptable. The dust removing device of the present invention may be applied to particularly an apparatus which needs to remove dust attached to a surface of the optical parts, among various electric apparatusses equipped with an imaging apparatus such as a taking lens unit interchangeable video camera, a copying machine, facsimile machine and a scanner.

An electronic apparatus according to an embodiment of the present invention will now be described. An electronic apparatus according to an embodiment includes a piezoelectric acoustic component equipped with a piezoelectric element or multilayered piezoelectric element. The piezoelectric acoustic component may be a speaker, a microphone, a surface acoustic wave (SAW) device, or the like.

Figure 14:
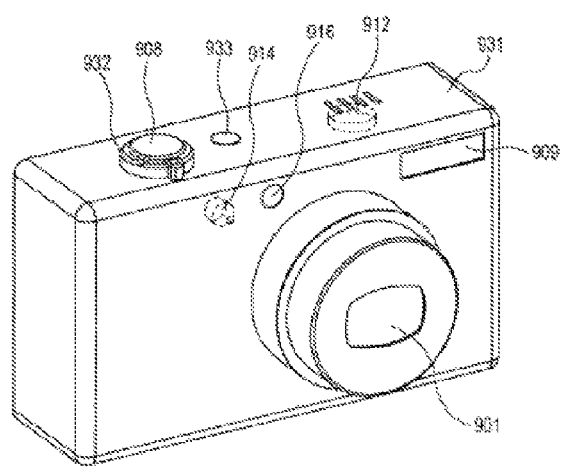
FIG. 14 is a schematic view showing an electronic apparatus according to an embodiment of the invention.

FIG. 14 is a perspective view of a digital camera, which is an example of the electronic apparatus according to the present invention, as viewed from the front of a main body 931. An optical device 901, a microphone 914, a strobe light unit 909, and an auxiliary light unit 916 are installed in the front face of the main body 931.

Since the microphone 914 is assembled inside the main body, it is indicated by a broken line. A hole for collecting sound from outside is formed at the front of the microphone 914.

A power button 933, a speaker 912, a zoom lever 932, and a release button 908 for executing focusing operation are installed in the upper surface of the main body 931. The speaker 912 is built inside the main body 931 and is indicated by a broken line. Holes for outputting sound are formed at the front of the speaker 912.

The piezoelectric acoustic component is used in at least one of the microphone 914, speaker 912, and a SAW device.

Although a digital camera is described as one example of the electronic apparatus of the present invention, the electronic apparatus is not limited to this and may be any electronic apparatus equipped with a piezoelectric acoustic component, such as a sound-reproducing apparatus, a sound-recording apparatus, a cellular phone, and an information terminal.

As described above, the piezoelectric element of the present invention is suitably applicable to the liquid discharge head, the liquid discharge apparatus, the ultrasonic motor, an optical apparatus, a vibration generator, a dust removing device, an imaging apparatus, and an electronic apparatus.

The present invention provides a novel piezoelectric ceramics that can achieve both high piezoelectric performance and a high Curie temperature. Note that, the piezoelectric ceramics of the present invention can be used in various applications such as a material for capacitors, a material for memories, and a material for sensors, utilizing its characteristic as dielectric.

Through the use of the piezoelectric ceramics of the present invention, it is possible to provide the liquid discharge head having the same or higher nozzle density and discharge force than the case where the piezoelectric ceramics containing lead is used. A liquid discharge apparatus equipped with a liquid discharge head according to an embodiment of the present invention can exhibit discharge force and discharge accuracy comparable or superior to a liquid discharge apparatus that uses a liquid discharge head including a lead-containing piezoelectric element.

Through the use of the piezoelectric ceramics of the present invention, it is possible to provide the ultrasonic motor having the same or higher driving force and durability than the case where the piezoelectric ceramics containing lead is used. An optical apparatus that uses the ultrasonic motor can exhibit durability and operation accuracy comparable or superior to an optical apparatus that uses an ultrasonic motor that includes a lead-containing piezoelectric element.

Through the use of the piezoelectric ceramics according to the present invention, it is possible to provide a vibration generator having vibration efficiency equal to or higher than a vibration generator that includes lead-containing piezoelectric ceramics.

Through the use of the vibration generator of the present invention, it is possible to provide a dust removing device having dust removing efficiency equal to or higher than a dust removing device that includes lead-containing piezoelectric ceramics.

Through the use of the dust removing device of the present invention, it is possible to provide an imaging apparatus having a dust removing function equal to or higher than an imaging apparatus that includes lead-containing piezoelectric ceramics.

An electronic apparatus that uses a piezoelectric acoustic component equipped with a piezoelectric element or multilayered piezoelectric element according to an embodiment of the present invention exhibits a sound-generating property comparable or superior to an electronic apparatus that includes a lead-containing piezoelectric element.

The piezoelectric ceramics of the present invention can be used in such a device as an ultrasonic oscillator, a piezoelectric actuator, a piezoelectric sensor, and a ferroelectric memory, as well as the liquid discharge head and the motor.

Hereinafter, the piezoelectric ceramics of the present invention is described more specifically by way of examples. However, the present invention is not limited by the following examples.

MANUFACTURING EXAMPLE 1

Synthesis of Hexagonal Barium Titanate

The reduction treatment of the tetragonal barium titanate powder produced by the hydrothermal synthesis method (produced by Sakai Chemical Industry Co., Ltd., having a particle size of 100 nm) was performed, and hence powder of hexagonal barium titanate was obtained. The reduction treatment was performed for 30 to 120 minutes in the atmosphere containing hydrogen at a volume concentration of 99% or more at atmospheric pressure and having a temperature of 1,400 to 1,500° C. The powder having been subjected to the reduction treatment was evaluated by the X-ray diffraction, with the result that a constituent phase of the powder was hexagonal barium titanate. Through this reduction treatment, the weight of the barium titanate powder was reduced by 0.2 wt %. In addition, the powder color was changed from white to blue. Next, the thermal treatment of the hexagonal barium titanate powder having been subjected to the reduction treatment was performed in the air at a temperature of 1,000° C. for 1 to 6 hours. The powder color became light blue, but the constituent phase of the powder did not change between before and after the thermal treatment. Hereinafter, this hexagonal barium titanate powder is referred to as "HB powder".

MANUFACTURING EXAMPLE 2

Synthesis of Hexagonal Barium Titanate Containing Mn

As raw materials, barium carbonate, titanium oxide (produced by Ishihara Sangyo Kaisha, Ltd., having a purity of 99.9%), and manganese monoxide were used, and hence powder having a composition expressed by a molar ratio of Ba:Ti:Mn=1.00:0.90:0.05 was produced. Powder of the raw materials was weighed so as to obtain the target composition and was mixed to produce mixed powder. The mixed powder was calcinated at a temperature of 900 to 1,250° C. in the air atmosphere for 2 to 20 hours. Next, the powder thus obtained through the calcination was crushed by a ball mill and classified with use of a sieve having a mesh of 50 to 250 µm. The steps from the calcination to the classification were performed one or two times. Niobium oxide powder was mixed into the calcinated powder having been subjected to the classification so that Mn and Nb had the same mols. The color of the obtained mixed powder was brown. According to the X-ray diffraction measurement, the sample was made of only hexagonal crystals. Hereinafter, hexagonal barium titanate containing Mn is referred to as "MB powder".

MANUFACTURING EXAMPLE 3

Preparation of Tetragonal Barium Titanate for Comparison

The thermal treatment of the tetragonal barium titanate powder produced by the hydrothermal synthesis method (produced by Sakai Chemical Industry Co., Ltd., having a particle size of 100 nm) was performed in the air at 1,000° C.

for 1 to 6 hours. The powder color was white. According to the X-ray diffraction measurement, the sample was made of only tetragonal crystals. Hereinafter, tetragonal barium titanate is referred to as "TB powder".

EXAMPLES 1 TO 16 AND COMPARATIVE EXAMPLES 1 TO 3

$$BaTiO_3—BiFeO_3—Bi(Ni_{0.5}Ti_{0.5})O_3$$

(Manufacturing Method)

As raw materials, hexagonal barium titanate (HB powder), bismuth oxide (produced by Rare Metallic Co., Ltd., having a purity of 99.999%), iron oxide (produced by Rare Metallic Co., Ltd., having a purity of 99.9%), nickel oxide (produced by Rare Metallic Co., Ltd., having a purity of 99.9%) and titanium oxide (produced by Ishihara Sangyo Kaisha, Ltd., having a purity of 99.9%) were used. The raw materials were weighed so as to obtain the composition of Table 1, and were mixed by dry process using the ball mill for 24 hours. The mixed powder was put in a melting pot made of alumina and was calcinated at a temperature of 800 to 900° C. in the air for six hours.

Next, the calcinated powder was crushed, and then a solution of a carboxylic dispersing agent (3 mass %) was added and mixed. Then, dispersion treatment was performed by using a pot mill so that the slurry was obtained. Next, the magnetic field was applied to the slurry, and hence magnetic field treatment was performed. The magnetic field treatment was performed by using a superconducting magnet (JMTD-10T180: manufactured by Japan Superconductor Technology, Inc.). With use of the superconducting magnet, a 10 T magnetic field was generated. Then, with use of a non-magnetic ultrasonic motor that is rotationally drivable in a magnetic field, a table was rotated at 30 rpm in the direction perpendicular to the magnetic field direction. A plaster container as the substrate was placed on the table, and the slurry was poured into the container on the table during the rotation drive so as to perform molding by the slip casting method. After that, the compact was taken out from the plaster container. The compact thus taken out was dried in the air for 24 hours.

The oxidation treatment of the obtained compact was performed at a temperature of 700° C. in the air atmosphere for 10 hours and further at a temperature of 900 to 1,000° C. in the air atmosphere for 6 hours, so as to obtain the piezoelectric ceramics according to the present invention, which was made of the perovskite-type metal oxide, or a sintered body of the metal oxide for comparison. Both sides of the piezoelectric ceramics and the sintered body were polished so that the thickness became 0.5 mm, respectively.

(Structure Evaluation)

The composition of the polished piezoelectric ceramics and metal oxide was evaluated by X-ray fluorescence analysis (XRF) in which a calibration curve is formed by ICP weight analysis. A crystal structure of the piezoelectric ceramics and the metal oxide were evaluated by 2θ-θ measurement of the X-ray diffraction (XRD). A result of the XRD was used to calculate the Lotgering factor F (LGF) indicating a degree of the (111) orientation. The relative densities of the piezoelectric ceramics and the metal oxide were determined by using a value actually measured by Archimedes method and a theoretical density determined from crystal structure analysis of the XRD. Average equivalent circular diameters and maximum equivalent circular diameters of crystal grains of the piezoelectric ceramics and the metal oxide were observed by SEM, and the average equivalent circular diameters were determined as an average value of the grains.

(Piezoelectric Property Evaluation)

In order to evaluate piezoelectric characteristic of the piezoelectric ceramics and the metal oxide, the piezoelectric ceramics and the metal oxide were processed in a strip shape having a thickness of 0.5 mm, a length of 15 mm, and a width of 4 mm, and silver electrodes were formed on the front and back surface thereof so as to produce a piezoelectric element of the present invention and an element for comparison.

The piezoelectric property of the above-mentioned elements was evaluated by determining the piezoelectric constant $d_{33}^*$ from the electric field and the distortion gradient of the electric field distortion curve. As a distortion value, a value when an electric field of 60 kV/cm was applied was adopted, and the piezoelectric constant was calculated. In addition, the Curie temperature was determined from a peak position of temperature characteristic of the dielectric constant. The temperature characteristic of the dielectric constant was determined by measuring the dielectric constant at 1 MHz every 10° C. while increasing temperature at 3° C. per minute in a range of −100° C. to 600° C.

COMPARATIVE EXAMPLE 4

$$BaTiO_3—BiFeO_3—Bi(Ni_{0.5}Ti_{0.5})O_3$$

(Manufacturing Method)

The metal oxide and element for comparison were obtained similarly to Example 11 except that the generated magnetic field was set to 0 T, namely no magnetic field was applied to the sample.

(Structure Evaluation and Piezoelectric Property Evaluation)

The evaluation was performed similarly to Examples 1 to 16.

COMPARATIVE EXAMPLE 5

$$BaTiO_3—BiFeO_3—Bi(Ni_{0.5}Ti_{0.5})O_3$$

(Manufacturing Method)

The metal oxide and element for comparison were obtained similarly to Example 11 except that the raw material of barium titanate was the TB powder.

(Structure Evaluation and Piezoelectric Property Evaluation)

The evaluation was performed similarly to Examples 1 to 16.

Figure 15:
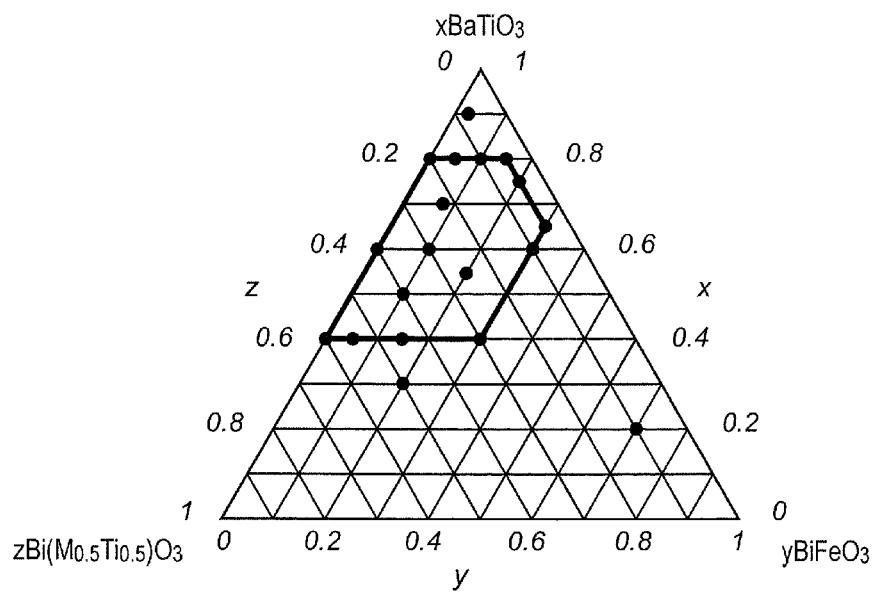
FIG. 15 is a triangle phase diagram illustrating a relationship of metal oxide compositions among Examples 1 to 16 and 24 to 39 of the present invention, and Comparative Examples 1 to 10.

FIG. 15 is a triangle phase diagram illustrating a relationship of composition among Examples 1 to 16 and Comparative Examples 1 to 5. A thick full line of FIG. 15 indicates a range corresponding to claim 1 of the present invention.

The compositions, manufacturing conditions, and evaluation results of Examples 1 to 16 and Comparative Examples 1 to 5 are shown in Table 1. In the table, x, y, and z in the column of composition indicate molar ratios of $BaTiO_3$, $BiFeO_3$, and $Bi(Ni_{0.5}Ti_{0.5})O_3$, respectively. In the column of crystal structure, "o" indicates that the crystal structure had a single phase of the perovskite-type structure.

TABLE 1

| | Composition | | | Manufacturing method | | Structure evaluation | | | Average equivalent circular diameter [μm] | Maximum equivalent circular diameter [μm] | Piezoelectric property | |
|---|---|---|---|---|---|---|---|---|---|---|---|---|
| | x | y | z | Barium titanate | Magnetic field | Crystal structure | Orientation | (111) LGF | | | Piezoelectric constant $d_{33}^*$ [pm/V] | Curie temperature [° C.] |
| Example 1 | 0.80 | 0.00 | 0.20 | Hexagonal | 10 T | ∘ | (111) | 0.62 | 1.5 | 7.7 | 105 | 190 |
| Example 2 | 0.80 | 0.05 | 0.15 | Hexagonal | 10 T | ∘ | (111) | 0.68 | 1.2 | 5.3 | 140 | 170 |
| Example 3 | 0.80 | 0.10 | 0.10 | Hexagonal | 10 T | ∘ | (111) | 0.65 | 0.6 | 5.1 | 160 | 160 |
| Example 4 | 0.80 | 0.15 | 0.05 | Hexagonal | 10 T | ∘ | (111) | 0.58 | 0.7 | 5.5 | 160 | 180 |
| Example 5 | 0.75 | 0.20 | 0.05 | Hexagonal | 10 T | ∘ | (111) | 0.50 | 0.9 | 6.2 | 180 | 210 |
| Example 6 | 0.70 | 0.08 | 0.22 | Hexagonal | 10 T | ∘ | (111) | 0.48 | 2.2 | 7.8 | 130 | 200 |
| Example 7 | 0.65 | 0.30 | 0.05 | Hexagonal | 10 T | ∘ | (111) | 0.41 | 3.7 | 8.9 | 205 | 220 |
| Example 8 | 0.60 | 0.00 | 0.40 | Hexagonal | 10 T | ∘ | (111) | 0.37 | 5.2 | 12 | 120 | 270 |
| Example 9 | 0.60 | 0.10 | 0.30 | Hexagonal | 10 T | ∘ | (111) | 0.36 | 2.9 | 9.7 | 130 | 250 |
| Example 10 | 0.60 | 0.30 | 0.10 | Hexagonal | 10 T | ∘ | (111) | 0.29 | 4.8 | 9.9 | 170 | 230 |
| Example 11 | 0.55 | 0.20 | 0.25 | Hexagonal | 10 T | ∘ | (111) | 0.33 | 3.0 | 7.1 | 220 | 220 |
| Example 12 | 0.50 | 0.10 | 0.40 | Hexagonal | 10 T | ∘ | (111) | 0.30 | 2.9 | 7.2 | 130 | 240 |
| Example 13 | 0.40 | 0.00 | 0.60 | Hexagonal | 10 T | ∘ | (111) | 0.25 | 3.1 | 9.0 | 110 | 290 |
| Example 14 | 0.40 | 0.05 | 0.55 | Hexagonal | 10 T | ∘ | (111) | 0.22 | 3.3 | 8.5 | 120 | 270 |
| Example 15 | 0.40 | 0.15 | 0.45 | Hexagonal | 10 T | ∘ | (111) | 0.24 | 4.6 | 9.4 | 130 | 250 |
| Example 16 | 0.40 | 0.30 | 0.30 | Hexagonal | 10 T | ∘ | (111) | 0.12 | 2.2 | 6.5 | 170 | 340 |
| Comparative Example 1 | 0.90 | 0.03 | 0.07 | Hexagonal | 10 T | ∘ | (111) | 0.78 | 0.4 | 2.9 | 110 | 70 |
| Comparative Example 2 | 0.30 | 0.20 | 0.50 | Hexagonal | 10 T | ∘ | Random | 0.07 | 5.7 | 16 | 30 | 390 |
| Comparative Example 3 | 0.20 | 0.70 | 0.10 | Hexagonal | 10 T | ∘ | (110) | −0.26 | 5.0 | 20 | 50 | 520 |
| Comparative Example 4 | 0.55 | 0.20 | 0.25 | Hexagonal | 0 T | ∘ | Random | 0.00 | 1.4 | 11 | 150 | 220 |
| Comparative Example 5 | 0.55 | 0.20 | 0.25 | Tetragonal | 10 T | ∘ | Random | −0.14 | 0.4 | 6.2 | 160 | 220 |

From a result of the fluorescent X-ray analysis, it was found that the compositions of the piezoelectric ceramics of the present invention and the metal oxide for comparison were as weighed.

Figure 16:
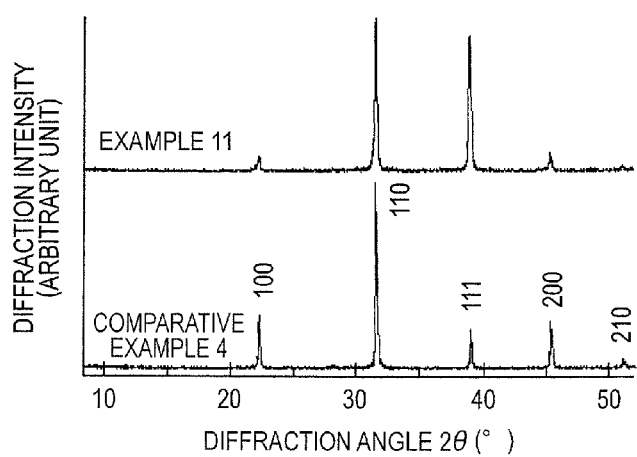
FIG. 16 is an X-ray diffraction diagram of Example 11 and Comparative Example 4.

From the structure analysis by the X-ray diffraction, it was found that the crystal phase of every sample was a single phase of the perovskite-type structure. Each of the piezoelectric ceramics of Examples 1 to 16 and Comparative Example 1 was (111) oriented, and the value of LGF indicating the degree of orientation was 0.12 or more. On the other hand, the sample of Comparative Example 2 had random orientation because a ratio of the hexagonal barium titanate in raw materials was small. The sample of Comparative Example 3 had the (110) orientation because a ratio of the bismuth ferrite component in the solid solution was large. The sample of Comparative Example 4 had random orientation because no magnetic field was applied. The sample of Comparative Example 5 had random orientation with a little (100) orientation component because tetragonal barium titanate was used as raw materials. As a typical example, an X-ray diffraction diagram of Example 11 and Comparative Example 4 is illustrated in FIG. 16. In addition, the relative densities were all 90% or more.

The piezoelectric constants $d_{33}^*$ of piezoelectric elements of Examples 1 to 16 were all 105 (pm/V) or more, and the Curie temperature was 160° C. or more. Particularly in the samples having a y-value of 0.05 or more, the piezoelectric constants $d_{33}^*$ were all 120 (pm/V) or more.

The samples of Examples 1 to 16 did not show a peak of dielectric constant due to structural phase transition at a temperature of −100° C. or more to the Curie temperature or less.

From the evaluation results of Example 11 and Comparative Examples 4 and 5, it is understood that the piezoelectric constant was improved by the (111) orientation even in the same composition. In addition, in Example 11, the same piezoelectric distortion was able to be observed even if the applied electric field was set to 80 kV/cm or more. However, in the cases of Comparative Examples 4 and 5, if the applied electric field was set to 80 kV/cm or more, the distortion was apt to be small due to an influence of leakage current. In other examples of other compositions too, there was a tendency of improving the piezoelectric constant $d_{33}^*$ by 50 pm/V or more than the sample having random orientation.

EXAMPLES 17 TO 23

Material Systems Containing Mn and Cu (Manufacturing Method)

As raw materials, hexagonal barium titanate (HB powder or MB powder), bismuth oxide (manufactured by Rare Metallic Co., Ltd.; purity is 99.999%), iron oxide (manufactured by Rare Metallic Co., Ltd.; purity is 99.9%), nickel oxide (manufactured by Rare Metallic Co., Ltd.; purity is 99.9%), titanium oxide (manufactured by Ishihara Sangyo Kaisha, Ltd.; purity is 99.9%), manganese carbonate, and copper oxide were used. Composition of Table 2 was achieved by weighing, and the piezoelectric ceramics of the present invention was manufactured similarly to Examples 1 to 16.

(Structure Evaluation and Piezoelectric Property evaluation)

The evaluation was performed similarly to Examples 1 to 16.

The compositions, manufacturing conditions, evaluation results of Examples 17 to 23 are shown in Table 2. In Table 2, x, y, and z in the column of composition indicate molar ratios of $BaTiO_3$, $BiFeO_3$, and $Bi(Ni_{0.5}Ti_{0.5})O_3$, respectively. In addition, an Mn amount and a Cu amount respectively indicate masses to 100 parts by mass of $xBaTiO_3$-$yBiFeO_3$-$zBi(Ni_{0.5}Ti_{0.5})O_3$. The barium titanate raw materials are all hexagonal. If the MB powder containing Mn is used, manganese carbonate is added so that a desired content of Mn is obtained. In the column of crystal structure, "o" indicates that the crystal structure had only the perovskite-type structure.

(manufactured by Rare Metallic Co., Ltd.; purity is 99.9%) was used instead of nickel oxide.

(Structure Evaluation and Piezoelectric Property Evaluation)

The evaluation was performed similarly to Examples 1 to 16 and Comparative Examples 1 to 5.

TABLE 2

|  | Composition | | | | | Manufacturing method | Structure evaluation | | Piezoelectric property | |
|---|---|---|---|---|---|---|---|---|---|---|
|  |  |  |  | Mn | Cu |  |  |  | Piezoelectric | Curie |
|  | x | y | z | amount (mass %) | amount (mass %) | Barium titanate | Crystal structure | (111) LGF | constant $d_{33}{}^*$ [pm/V] | temperature [° C.] |
| Example 17 | 0.80 | 0.00 | 0.20 | 0.05 | 0.00 | HB | o | 0.65 | 120 | 190 |
| Example 18 | 0.80 | 0.05 | 0.15 | 0.60 | 0.50 | HB | o | 0.73 | 160 | 170 |
| Example 19 | 0.80 | 0.15 | 0.05 | 0.00 | 0.05 | HB | o | 0.58 | 160 | 180 |
| Example 20 | 0.65 | 0.30 | 0.05 | 0.50 | 0.00 | HB | o | 0.45 | 210 | 220 |
| Example 21 | 0.40 | 0.00 | 0.60 | 1.00 | 1.00 | MB | o | 0.33 | 130 | 290 |
| Example 22 | 0.40 | 0.15 | 0.45 | 3.00 | 0.00 | MB | o | 0.30 | 130 | 250 |
| Example 23 | 0.40 | 0.30 | 0.30 | 0.00 | 3.00 | HB | o | 0.28 | 180 | 340 |

From a result of the fluorescent X-ray analysis, it was found that the compositions of the piezoelectric ceramics of the present invention and the metal oxide for comparison were as weighed.

From the structure analysis by the X-ray diffraction, it was found that the crystal phase of every sample was a single phase of the perovskite-type structure. Each of the piezoelectric ceramics of Examples 17 to 23 was (111) oriented, and the value of LGF indicating the degree of orientation was 0.28 or more. In addition, the relative density was 96% or more in every sample and apt to be larger than those of Examples 1 to 16 containing no manganese or copper.

The piezoelectric constants $d_{33}{}^*$ of piezoelectric elements of Examples 17 to 23 were all 120 (pm/V) or more, and the Curie temperature was 170° C. or more. Particularly in the samples having a y-value of 0.05 or more, the piezoelectric constants $d_{33}{}^*$ were all 130 (pm/V) or more.

The samples of Examples 17 to 23 did not show a peak of dielectric constant due to structural phase transition at a temperature of −100° C. or more to the Curie temperature or less.

EXAMPLES 24 TO 39 AND COMPARATIVE EXAMPLES 6 TO 8

$BaTiO_3$—$BiFeO_3$—$Bi(Mg_{0.5}Ti_{0.5})O_3$ (Manufacturing Method)

The piezoelectric ceramics and piezoelectric elements of the present invention, and metal oxides and elements for comparison were obtained similarly to Examples 1 to 16 and Comparative Examples 1 to 3 except that magnesium oxide

COMPARATIVE EXAMPLE 9

$BaTiO_3$—$BiFeO_3$—$Bi(Mg_{0.5}Ti_{0.5})O_3$ (Manufacturing Method)

The metal oxide and element for comparison were obtained similarly to Example 34 except that the generated magnetic field was set to 0 T, namely no magnetic field was applied to the sample.

(Structure Evaluation and Piezoelectric Property Evaluation)

The evaluation was performed similarly to Examples 1 to 16.

COMPARATIVE EXAMPLE 10

$BaTiO_3$—$BiFeO_3$—$Bi(Mg_{0.5}Ti_{0.5})O_3$ (Manufacturing Method)

The metal oxide and element for comparison were obtained similarly to Example 34 except that the raw material of barium titanate was the TB powder.

(Structure Evaluation and Piezoelectric Property Evaluation)

The evaluation was performed similarly to Examples 1 to 16.

The compositions are the same as those of Examples 1 to 16 and Comparative Examples 1 to 5 except that the nickel was replaced with magnesium, and hence a relationship of the composition is as illustrated in FIG. 15.

The compositions, manufacturing conditions, evaluation results of Examples 1 to 16 and Comparative Examples 1 to 5 are shown in Table 3. In Table 3, x, y, and z in the column of composition indicate molar ratios of $BaTiO_3$, $BiFeO_3$, and $Bi(Mg_{0.5}Ti_{0.5})O_3$, respectively. In the column of crystal structure, "o" and "x" indicate that the crystal structure had a single phase of the perovskite-type structure, and that a different phase existed, respectively.

From the evaluation results of Example 34 and Comparative Examples 9 and 10, it is understood that the piezoelectric constant was improved by the (111) orientation even in the same composition. In addition, in Example 34, the same piezoelectric distortion was able to be observed even if the applied electric field was set to 80 kV/cm or more. However,

TABLE 3

| | Composition | | | Manufacturing method | | Structure evaluation | | | Average equivalent circular diameter [μm] | Maximum equivalent circular diameter [μm] | Piezoelectric property | |
|---|---|---|---|---|---|---|---|---|---|---|---|---|
| | x | y | z | Barium titanate | Magnetic field | Crystal structure | Orientation | (111) LGF | | | Piezoelectric constant $d_{33}^*$ [pm/V] | Curie temperature [° C.] |
| Example 24 | 0.80 | 0.00 | 0.20 | Hexagonal | 10 T | o | (111) | 0.57 | 0.4 | 4.8 | 120 | 190 |
| Example 25 | 0.80 | 0.05 | 0.15 | Hexagonal | 10 T | o | (111) | 0.60 | 0.8 | 5.1 | 160 | 170 |
| Example 26 | 0.80 | 0.10 | 0.10 | Hexagonal | 10 T | o | (111) | 0.58 | 0.5 | 5.0 | 170 | 160 |
| Example 27 | 0.80 | 0.15 | 0.05 | Hexagonal | 10 T | o | (111) | 0.49 | 0.5 | 5.0 | 180 | 170 |
| Example 28 | 0.75 | 0.20 | 0.05 | Hexagonal | 10 T | o | (111) | 0.46 | 1.1 | 7.2 | 210 | 210 |
| Example 29 | 0.70 | 0.08 | 0.22 | Hexagonal | 10 T | o | (111) | 0.42 | 2.0 | 8.0 | 170 | 200 |
| Example 30 | 0.65 | 0.30 | 0.05 | Hexagonal | 10 T | o | (111) | 0.36 | 2.5 | 8.3 | 230 | 210 |
| Example 31 | 0.60 | 0.00 | 0.40 | Hexagonal | 10 T | o | (111) | 0.31 | 4.2 | 10 | 140 | 260 |
| Example 32 | 0.60 | 0.10 | 0.30 | Hexagonal | 10 T | o | (111) | 0.29 | 3.4 | 8.8 | 170 | 250 |
| Example 33 | 0.60 | 0.30 | 0.10 | Hexagonal | 10 T | o | (111) | 0.25 | 3.9 | 8.5 | 200 | 220 |
| Example 34 | 0.55 | 0.20 | 0.25 | Hexagonal | 10 T | o | (111) | 0.30 | 2.2 | 6.1 | 210 | 220 |
| Example 35 | 0.50 | 0.10 | 0.40 | Hexagonal | 10 T | o | (111) | 0.29 | 2.5 | 8.8 | 120 | 240 |
| Example 36 | 0.40 | 0.00 | 0.60 | Hexagonal | 10 T | o | (111) | 0.26 | 5.5 | 11 | 130 | 280 |
| Example 37 | 0.40 | 0.05 | 0.55 | Hexagonal | 10 T | o | (111) | 0.16 | 3.9 | 8.4 | 130 | 270 |
| Example 38 | 0.40 | 0.15 | 0.45 | Hexagonal | 10 T | o | (111) | 0.15 | 5.0 | 10 | 150 | 250 |
| Example 39 | 0.40 | 0.30 | 0.30 | Hexagonal | 10 T | o | (111) | 0.10 | 3.8 | 8.5 | 190 | 340 |
| Comparative Example 6 | 0.90 | 0.03 | 0.07 | Hexagonal | 10 T | o | (111) | 0.66 | 0.5 | 2.5 | 115 | 60 |
| Comparative Example 7 | 0.30 | 0.20 | 0.50 | Hexagonal | 10 T | o | Random | 0.08 | 5.0 | 14 | 20 | 390 |
| Comparative Example 8 | 0.20 | 0.70 | 0.10 | Hexagonal | 10 T | o | (110) | −0.22 | 4.5 | 11 | 60 | 520 |
| Comparative Example 9 | 0.55 | 0.20 | 0.25 | Hexagonal | 0 T | o | Random | 0.00 | 2.1 | 8.8 | 160 | 200 |
| Comparative Example 10 | 0.55 | 0.20 | 0.25 | Tetragonal | 10 T | o | Random | −0.20 | 0.3 | 2.6 | 170 | 200 |

From a result of the fluorescent X-ray analysis, it was found that the compositions of the piezoelectric ceramics of the present invention and the metal oxide for comparison were as weighed.

From the structure analysis by the X-ray diffraction, it was found that the crystal phase of every sample was a single phase of the perovskite-type structure. Each of the piezoelectric ceramics of Examples 24 to 39 and Comparative Example 6 was (111) oriented, and the value of LGF indicating the degree of orientation was 0.10 or more. On the other hand, the sample of Comparative Example 7 had random orientation because a ratio of hexagonal barium titanate in raw materials was small. The sample of Comparative Example 8 had the (110) orientation because a ratio of the bismuth ferrite component in the solid solution was large. The sample of Comparative Example 9 had random orientation because no magnetic field was applied. The sample of Comparative Example 10 had random orientation with a little (100) orientation component because tetragonal barium titanate was used as raw materials. In addition, the relative densities were all 90% or more.

The piezoelectric constants $d_{33}^*$ of piezoelectric elements of Examples 24 to 39 were all 120 (pm/V) or more, and the Curie temperature was 160° C. or more.

The samples of Examples 24 to 39 did not show a peak of dielectric constant due to structural phase transition at a temperature of −100° C. or more to the Curie temperature or less.

in the cases of Comparative Examples 9 and 10, if the applied electric field was set to 80 kV/cm or more, the distortion was apt to be small due to an influence of leakage current. In other examples of other compositions too, there was a tendency of improving the piezoelectric constant $d_{33}^*$ by 50 pm/V or more than the sample having random orientation.

EXAMPLES 40 TO 46

Material Systems Containing Mn and Cu (Manufacturing Method)

The piezoelectric ceramics and piezoelectric elements of the present invention were obtained similarly to Examples 17 to 23 except that magnesium oxide (manufactured by Rare Metallic Co., Ltd.; purity is 99.9%) was used instead of nickel oxide.

(Structure Evaluation and Piezoelectric Property Evaluation)

The evaluation was performed similarly to Examples 17 to 23.

The compositions, manufacturing conditions, evaluation results of Examples 40 to 46 are shown in Table 4. In Table 4, x, y, and z in the column of composition indicate molar ratios of $BaTiO_3$, $BiFeO_3$, and $Bi(Mg_{0.5}Ti_{0.5})O_3$, respectively. In addition, an Mn amount and a Cu amount respectively indicate masses to 100 parts by mass of $xBaTiO_3$-$yBiFeO_3$-$zBi(Mg_{0.5}Ti_{0.5})O_3$. The barium titanate raw materials are all hexagonal. If the MB powder containing Mn is used, manganese carbonate is added so that a desired content of Mn is obtained. In the column of crystal structure, "○" indicates that the crystal structure had only a single phase of the perovskite-type structure.

6A and 6B was prepared. The rotary behavior of the motor in response to application of an alternating voltage was confirmed.

(Lens Barrel Using an Ultrasonic Motor Including a Piezoelectric Element of Example 11 and 34)

An optical apparatus shown in FIGS. 7A and 7B was fabricated by using an ultrasonic motor that uses a piezoelectric

TABLE 4

| | Composition | | | | | Manufacturing method | Structure evaluation | | Piezoelectric property | |
|---|---|---|---|---|---|---|---|---|---|---|
| | | | | Mn | Cu | | | | Piezoelectric | Curie |
| | x | y | z | amount (mass %) | amount (mass %) | Barium titanate | Crystal structure | (111) LGF | constant $d_{33}^*$ [pm/V] | temperature [° C.] |
| Example 40 | 0.80 | 0.00 | 0.20 | 0.05 | 0.00 | HB | ○ | 0.61 | 130 | 190 |
| Example 41 | 0.80 | 0.05 | 0.15 | 0.60 | 0.50 | HB | ○ | 0.69 | 180 | 170 |
| Example 42 | 0.80 | 0.15 | 0.05 | 0.00 | 0.05 | HB | ○ | 0.54 | 190 | 170 |
| Example 43 | 0.65 | 0.30 | 0.05 | 0.50 | 0.00 | HB | ○ | 0.40 | 240 | 210 |
| Example 44 | 0.40 | 0.00 | 0.60 | 1.00 | 1.00 | MB | ○ | 0.33 | 150 | 280 |
| Example 45 | 0.40 | 0.15 | 0.45 | 3.00 | 0.00 | MB | ○ | 0.28 | 170 | 250 |
| Example 46 | 0.40 | 0.30 | 0.30 | 0.00 | 3.00 | HB | ○ | 0.21 | 200 | 340 |

From a result of the fluorescent X-ray analysis, it was found that the compositions of the piezoelectric ceramics of the present invention and the metal oxide for comparison were as weighed.

From the structure analysis by the X-ray diffraction, it was found that the crystal phase of every sample was a single phase of the perovskite-type structure. Each of the piezoelectric ceramics of Examples 40 to 46 was (111) oriented, and the value of LGF indicating the degree of orientation was 0.21 or more. In addition, the relative density was 96% or more in every sample and apt to be larger than those of Examples 24 to 39 containing no manganese or copper.

An average equivalent circular diameter of crystal grains of Examples 40 to 46 was 0.5 μm or more to 5.0 μm or less, and a maximum equivalent circular diameter of the crystal grains of Examples 40 to 46 was 5.0 μm or more to 10.0 μm or less.

The piezoelectric constants $d_{33}^*$ of piezoelectric elements of Examples 40 to 46 were all 130 (pm/V) or more, and the Curie temperature was 170° C. or more. Particularly in the samples having a y-value of 0.05 or more, the piezoelectric constants $d_{33}^*$ were all 170 (pm/V) or more.

The samples of Examples 17 to 23 did not show a peak of dielectric constant due to structural phase transition at a temperature of −100° C. or more to the Curie temperature or less.

(Liquid Discharge Head Using the Piezoelectric Elements of Examples 11 and 34)

Through the use of the same piezoelectric ceramics as in Examples 11 and 34, a liquid discharge head illustrated in FIGS. 3A and 3B was prepared. Ink discharge from the liquid discharge head in response to input electric signals was confirmed.

(Liquid Discharge Apparatus Including a Liquid Discharge Head Including a Piezoelectric Element of Example 11 and 34)

A liquid discharge apparatus shown in FIG. 4 was fabricated by using a liquid discharge head shown in FIGS. 3A and 3B including a piezoelectric element of Example 11 and 34. Discharge of ink onto a recording medium in response to input electrical signals was confirmed.

(Ultrasonic Motor Using the Piezoelectric Elements of Examples 11 and 34)

Through the use of the same piezoelectric ceramics as in Examples 11 and 34, an ultrasonic motor illustrated in FIGS.

element of Example 11 and 34. Automatic focusing operation in response to applied AC voltage was confirmed.

(Dust Removing Device Using Piezoelectric Ceramics of Examples 11 and 34)

Through the use of the same piezoelectric ceramics as in Examples 11 and 34, a dust removing device illustrated in FIGS. 9A and 9B was prepared. When an alternating voltage was applied after spraying plastic beads, a satisfactory dust-removing rate was confirmed.

(Imaging Apparatus Using Dust Removing Device of Examples 11 and 34)

Through the use of a dust removing device using the same piezoelectric element as in Examples 11 and 34, an imaging apparatus illustrated in FIG. 12 was prepared. When the dust removing device built in the imaging apparatus was operated, dust on a surface of the image pickup unit was satisfactorily removed and an image without defect caused by dust was obtained.

(Electronic Apparatus Using a Piezoelectric Acoustic Component Including a Piezoelectric Element of Example 11 and 34)

An electronic apparatus shown in FIG. 14 was fabricated by using a piezoelectric acoustic component including a piezoelectric element of Example 11 and 34. Operation of the speaker in accordance with an AC voltage applied was confirmed.

According to the present invention, it is possible to provide a piezoelectric ceramics having high piezoelectric performance without ingredients harmful to the environment. In addition, the present invention can provide the piezoelectric element, the liquid discharge head, the liquid discharge apparatus, the ultrasonic motor, the optical apparatus, the vibration generator, the dust removing device, the imaging apparatus, the electric apparatus, which use the piezoelectric ceramics.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-194101, filed Sep. 6, 2011, and Japanese Patent Application No. 2012-189004, filed Aug. 29, 2012, which are hereby incorporated by reference herein in their entirety.

What is claimed is:

1. Piezoelectric ceramics comprising a perovskite-type metal oxide, which are (111) oriented in a pseudocubic expression and are expressed by general formula (1):

$$xBaTiO_3\text{-}yBiFeO_3\text{-}zBi(M_{0.5}Ti_{0.5})O_3 \qquad (1),$$

where M represents at least one type of element selected from the group consisting of Mg and Ni, x satisfies $0.40 \leq x \leq 0.80$, y satisfies $0 \leq y \leq 0.30$, z satisfies $0.05 \leq z \leq 0.60$, and $x+y+z=1$ is satisfied.

2. The piezoelectric ceramics according to claim 1, wherein in the general formula (1), x satisfies $0.40 \leq x \leq 0.80$, y satisfies $0.05 \leq y \leq 0.30$, and z satisfies $0.05 \leq z \leq 0.55$.

3. The piezoelectric ceramics according to claim 1, wherein a Lotgering factor F, which indicates a degree of (111) orientation of the piezoelectric ceramics, is 0.10 or more to 1.00 or less in an X-ray diffraction method.

4. The piezoelectric ceramics according to claim 1, wherein the perovskite-type metal oxide contains at least one of manganese and copper at 0.05 mass % or more to 3.0 mass % or less.

5. The piezoelectric ceramics according to claim 1, wherein an average equivalent circular diameter of crystal grains of the piezoelectric ceramics is 500 nm or more to 5 μm or less, and
wherein a maximum equivalent circular diameter of the crystal grains is 5 μm or more to 10 μm or less.

6. A method of manufacturing a piezoelectric ceramics according to claim 1, comprising:
obtaining a slurry containing hexagonal barium titanate, Bi, Ti, and one of Mg and Ni;
placing the slurry on a substrate;
applying a magnetic field to the slurry to obtain a compact; and
performing oxidation treatment of the compact.

7. A piezoelectric element comprising:
a first electrode;
a piezoelectric ceramics; and
a second electrode,
wherein the piezoelectric ceramics comprise the piezoelectric ceramics according to claim 1.

8. A liquid discharge head comprising:
a liquid chamber comprising a vibration portion including the piezoelectric element according to claim 7; and
a ejection port communicating with the liquid chamber.

9. A liquid discharge apparatus comprising:
a transport unit configured to transport a recording medium; and
the liquid discharge head according to claim 8.

10. An ultrasonic motor comprising:
a vibration body including the piezoelectric element according to claims 7; and
a moving body that contacts with the vibration body.

11. An optical apparatus comprising a driving unit including the ultrasonic motor according to claim 10.

12. A vibration generator comprising a vibration body including the piezoelectric element according to claim 7.

13. A dust removing device comprising a vibration portion including the vibration generator according to claim 12.

14. An imaging apparatus comprising:
the dust removing device according to claim 13; and
an image pickup element unit,
wherein a vibration member of the dust removing device is provided on a side of a light receiving surface of the image pickup element unit.

15. An electronic apparatus comprising:
a piezoelectric acoustic component including the piezoelectric element according to claim 7.

16. The method according to claim 6, wherein the slurry further comprises Fe.

* * * * *